(12) United States Patent
Yoshikawa et al.

(10) Patent No.: US 10,796,882 B2
(45) Date of Patent: Oct. 6, 2020

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventors: Ryoichi Yoshikawa, Kawasaki (JP); Hideo Inoue, Miura-gun (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/363,449

(22) Filed: Mar. 25, 2019

(65) Prior Publication Data

US 2019/0304748 A1 Oct. 3, 2019

(30) Foreign Application Priority Data

Mar. 29, 2018 (JP) .................. 2018-063857

(51) Int. Cl.
 *H01J 37/31* (2006.01)
 *H01J 37/30* (2006.01)
 (Continued)

(52) U.S. Cl.
 CPC ...... *H01J 37/3177* (2013.01); *G03F 7/70433* (2013.01); *H01J 37/3045* (2013.01); *H01J 2237/31769* (2013.01)

(58) Field of Classification Search
 CPC ........... H01J 37/3177; H01J 2237/0435; H01J 2237/31774; H01J 37/045; H01J 37/3026; H01J 37/3174; H01J 2237/024; H01J 2237/2817; H01J 2237/30472; H01J 37/28; H01J 37/3045; H01J 2237/0216; H01J 2237/0432; H01J 2237/0437; (Continued)

(56) References Cited

U.S. PATENT DOCUMENTS 7,842,926 B2 11/2010 Olsson et al.
8,710,465 B2 4/2014 Van De Peut et al.
(Continued)

FOREIGN PATENT DOCUMENTS

JP 2007-517239 6/2007
JP 2013-55144 3/2013
JP 2014-7379 1/2014

*Primary Examiner* — David A Vanore
(74) *Attorney, Agent, or Firm* — Oblon, McClelland, Maier & Neustadt, L.L.P.

(57) ABSTRACT

According to one aspect of the present invention, a charged particle beam writing apparatus includes correction figure data generation circuitry configured to generate pattern data of a correction figure pattern for correcting a figure portion detected, where the pattern data includes dose information to identify a dose of the correction figure pattern; correction figure pattern data conversion circuitry configured to convert the pattern data of the correction figure pattern into correction figure pattern pixel data defining a value corresponding to a dose for the each pixel, based on pixel setting common to that of the writing pattern pixel data; and combined-value pixel data generation circuitry configured to generate, for the each pixel, combined-value pixel data by adding the value defined in the writing pattern pixel data and the value defined in the correction figure pattern pixel data.

19 Claims, 21 Drawing Sheets

(51) Int. Cl.
   *H01J 37/317* (2006.01)
   *G03F 7/20* (2006.01)
   *H01J 37/304* (2006.01)

(58) Field of Classification Search
   CPC .......... H01J 2237/15; H01J 2237/1536; H01J 2237/202; H01J 2237/20214; H01J 2237/20228; H01J 2237/22
   USPC .................................. 250/492.3, 311, 492.1
   See application file for complete search history.

(56) References Cited

U.S. PATENT DOCUMENTS

| | | |
|---|---|---|
| 8,710,467 B2 | 4/2014 | Yoshikawa et al. |
| 8,729,507 B2 | 5/2014 | Yoshikawa et al. |
| 8,907,306 B2 | 12/2014 | Yoshikawa et al. |
| 9,343,268 B2 | 5/2016 | Yoshikawa et al. |
| 9,548,183 B2* | 1/2017 | Yashima ............. H01J 37/1472 |
| 9,869,650 B2* | 1/2018 | Kikuiri ................. H01J 37/244 |
| 2008/0245965 A1* | 10/2008 | Sugiyama ............. B82Y 10/00 250/311 |
| 2012/0234082 A1* | 9/2012 | Yu ...................... G01N 23/2204 73/61.41 |
| 2012/0286173 A1 | 11/2012 | Van De Peut et al. |
| 2014/0124684 A1* | 5/2014 | Matsumoto ......... H01J 37/3174 250/492.3 |
| 2015/0254393 A1* | 9/2015 | Fujimura ............ H01J 37/3175 250/492.22 |
| 2019/0198290 A1* | 6/2019 | Inoue ................... H01J 37/147 |
| 2019/0198294 A1* | 6/2019 | Inoue ................... H01J 37/045 |
| 2019/0304748 A1* | 10/2019 | Yoshikawa ......... H01J 37/3177 |
| 2019/0304749 A1* | 10/2019 | Yoshikawa ........... H01J 37/304 |

* cited by examiner

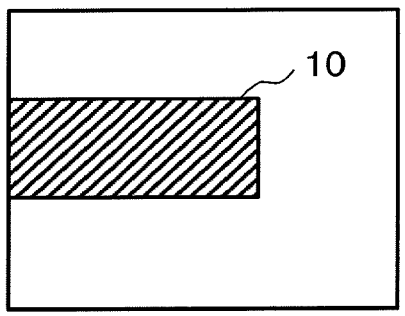
FIG.10A
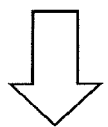
Writing Figure Data
| 0 | 0 | 0 | 0 | 0 | 0 | 0 | 0 |
|---|---|---|---|---|---|---|---|
| 0 | 0 | 0 | 0 | 0 | 0 | 0 | 0 |
| 100 | 100 | 100 | 100 | 100 | 100 | 0 | 0 |
| 100 | 100 | 100 | 100 | 100 | 100 | 0 | 0 |
| 100 | 100 | 100 | 100 | 100 | 100 | 0 | 0 |
| 100 | 100 | 100 | 100 | 100 | 100 | 0 | 0 |
| 0 | 0 | 0 | 0 | 0 | 0 | 0 | 0 |
| 0 | 0 | 0 | 0 | 0 | 0 | 0 | 0 |
FIG.10B
Pixelation
Generate Correction Figure
Grid Position Information
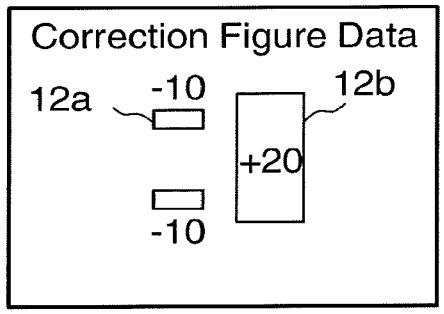
FIG.10C
Pixelation
| 0 | 0 | 0 | 0 | 0 | 0 | 0 | 0 |
|---|---|---|---|---|---|---|---|
| 0 | 0 | 0 | 0 | 0 | 10 | 10 | 0 |
| 0 | 0 | -10 | -10 | 0 | 20 | 20 | 0 |
| 0 | 0 | 0 | 0 | 0 | 20 | 20 | 0 |
| 0 | 0 | 0 | 0 | 0 | 20 | 20 | 0 |
| 0 | 0 | -10 | -10 | 0 | 20 | 20 | 0 |
| 0 | 0 | 0 | 0 | 0 | 10 | 10 | 0 |
| 0 | 0 | 0 | 0 | 0 | 0 | 0 | 0 |
FIG.10D

| 0 | 0 | 0 | 0 | 0 | 0 | 0 | 0 |
|---|---|---|---|---|---|---|---|
| 0 | 0 | 0 | 0 | 0 | 0 | 0 | 0 |
| 100 | 100 | 100 | 100 | 100 | 100 | 0 | 0 |
| 100 | 100 | 100 | 100 | 100 | 100 | 0 | 0 |
| 100 | 100 | 100 | 100 | 100 | 100 | 0 | 0 |
| 100 | 100 | 100 | 100 | 100 | 100 | 0 | 0 |
| 0 | 0 | 0 | 0 | 0 | 0 | 0 | 0 |
| 0 | 0 | 0 | 0 | 0 | 0 | 0 | 0 |

FIG.12A

Add per pixel

| 0 | 0 | 0 | 0 | 0 | 0 | 0 | 0 |
|---|---|---|---|---|---|---|---|
| 0 | 0 | 0 | 0 | 0 | 10 | 10 | 0 |
| 0 | 0 | -10 | -10 | 0 | 20 | 20 | 0 |
| 0 | 0 | 0 | 0 | 0 | 20 | 20 | 0 |
| 0 | 0 | 0 | 0 | 0 | 20 | 20 | 0 |
| 0 | 0 | -10 | -10 | 0 | 20 | 20 | 0 |
| 0 | 0 | 0 | 0 | 0 | 10 | 10 | 0 |
| 0 | 0 | 0 | 0 | 0 | 0 | 0 | 0 |

FIG.12B

| 0 | 0 | 0 | 0 | 0 | 0 | 0 | 0 |
|---|---|---|---|---|---|---|---|
| 0 | 0 | 0 | 0 | 0 | 10 | 10 | 0 |
| 100 | 100 | 90 | 90 | 100 | 120 | 20 | 0 |
| 100 | 100 | 100 | 100 | 100 | 120 | 20 | 0 |
| 100 | 100 | 100 | 100 | 100 | 120 | 20 | 0 |
| 100 | 100 | 90 | 90 | 100 | 120 | 20 | 0 |
| 0 | 0 | 0 | 0 | 0 | 10 | 10 | 0 |
| 0 | 0 | 0 | 0 | 0 | 0 | 0 | 0 |

FIG.12C

Dose correction Map Data

Execute writing

Correction Gray Map Figure Example

| 0 | 0 | 0 | 0 | 0   | 0   | 0   | 0  | 0  | 0  | 0   | 0 |
|---|---|---|---|-----|-----|-----|----|----|----|-----|---|
| 0 | 0 | 0 | 0 | 0   | 0   | 0   | 10 | 40 | 80 | 100 | 0 |
| 0 | 0 | 0 | 0 | -10 | -20 | -10 | 0  | 0  | 0  | 80  | 0 |
| 0 | 0 | 0 | 0 | 0   | 0   | 0   | 0  | 0  | 0  | 40  | 0 |
| 0 | 0 | 0 | 0 | 0   | 0   | 0   | 0  | 0  | 0  | 30  | 0 |
| 0 | 0 | 0 | 0 | 0   | 0   | 0   | 0  | 0  | 0  | 20  | 0 |
| 0 | 0 | 0 | 0 | 0   | 0   | 0   | 0  | 0  | 0  | 20  | 0 |
| 0 | 0 | 0 | 0 | 0   | 0   | 0   | 0  | 0  | 0  | 30  | 0 |
| 0 | 0 | 0 | 0 | 0   | 0   | 0   | 0  | 0  | 0  | 40  | 0 |
| 0 | 0 | 0 | 0 | -10 | -20 | -10 | 0  | 0  | 0  | 80  | 0 |
| 0 | 0 | 0 | 0 | 0   | 0   | 0   | 10 | 40 | 80 | 100 | 0 |
| 0 | 0 | 0 | 0 | 0   | 0   | 0   | 0  | 0  | 0  | 0   | 0 |

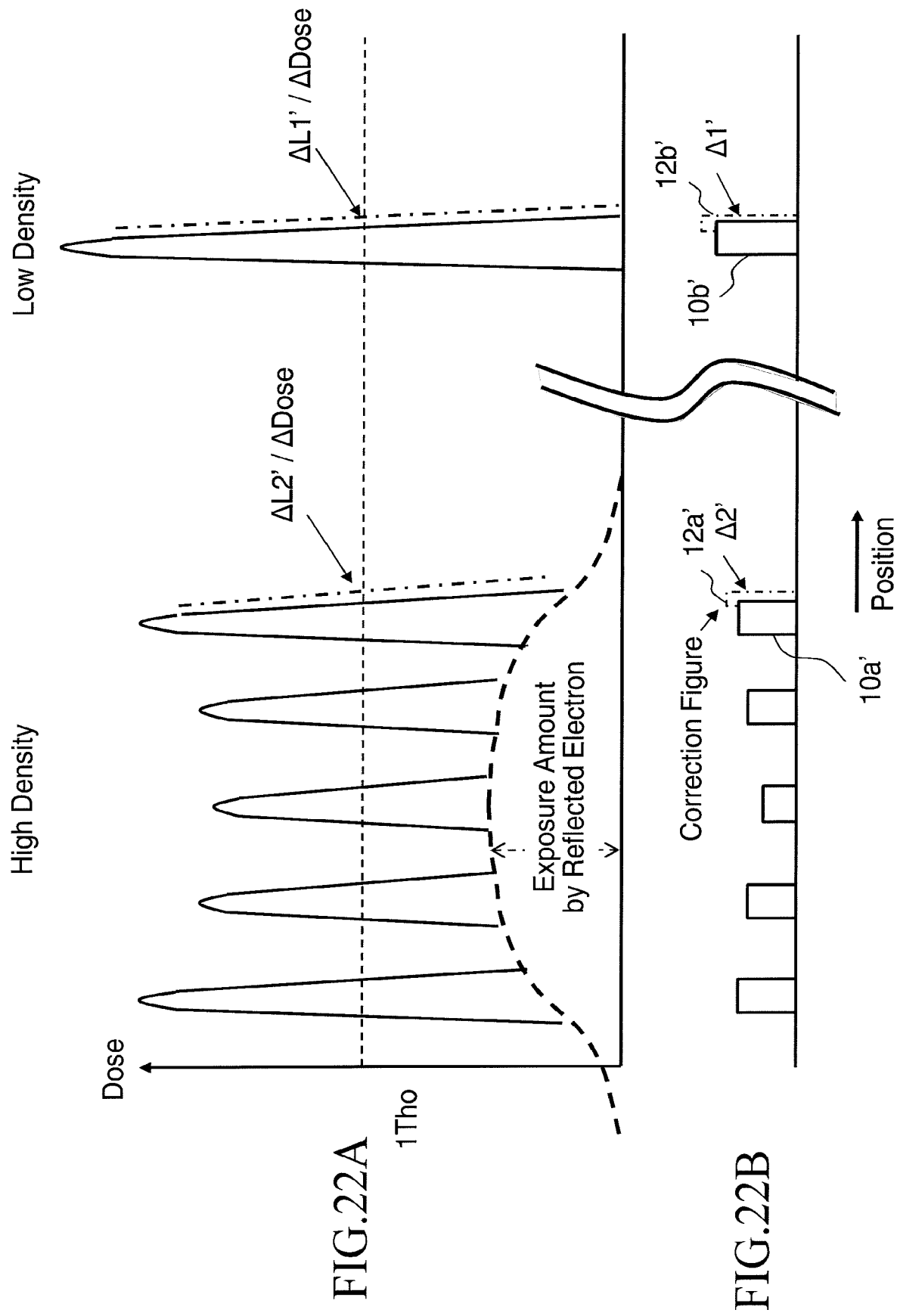

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from prior Japanese Patent Application No. 2018-063857 filed on Mar. 29, 2018 in Japan, the entire contents of which are incorporated herein by reference.

BACKGROUND OF THE INVENTION

Field of the Invention

Embodiments of the present invention relate to a charged particle beam writing apparatus and a charged particle beam writing method, and, for example, relate to a method of raster writing using electron beams.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" patterns on a wafer and the like with electron beams.

For example, as a known example of employing the electron beam writing technique, there is a writing apparatus using multiple beams. Since it is possible for multi-beam writing to irradiate multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system, and deflects it by a deflector to irradiate a desired position on a target object or "sample".

In multi-beam writing, the dose of each beam is individually controlled based on the irradiation time. Therefore, individual blanking mechanisms which can individually control on/off of each beam are arranged in an array. Then, a desired pattern is written by making the target object surface pixelated, and applying a beam based on pixel data defining the dose for each pixel. Here, when performing writing based on design data, a writing pattern may deviate from a desired shape. This problem occurs not only in the multi-beam writing but also in a variable shaped beam (VSB) writing apparatus using a single beam and a Gaussian beam writing apparatus. There may be various factors in that a writing pattern shape deviates from a desired shape. Such factors are, for example, influence by an interaction such as scattering between beam and substrate, or between beam and resist applied to the surface, dimension or shape dependency as characteristics of a resist development process, and dimension or shape dependency by etching conditions. The shape deviation due to such a factor tends to become more remarkable at a finer (minuter) dimension part. Therefore, a correction method with high accuracy needs to be performed to the recent demand for high precision.

To solve this problem, there is a method of correcting the shape of a pattern to be written, by defining the dose modulation amount for each figure pattern in order to perform writing based on the modulated dose amount. However, according to this correction method, it is difficult to carry out a partial correction for a local part in a figure pattern. Besides, if the figure pattern is made small to execute minute correction, it has a problem in that the data amount increases extremely. Moreover, although not with respect to charged particle beam writing, there is proposed a method of correcting the pattern shape by reconfiguring the image by performing processing called an area/region sampling for raster data after pixelating (or rasterizing) the figure pattern (e.g., refer to Japanese Unexamined Patent Application Publication (Translation of PCT Application) No. 2007-517239). According to this method, in raster data, calculation for correcting the value of the pixel at the center of each small region is performed based on values and arrangement of pixels included in the small region concerned. This calculation is executed for all the pixels (namely, all the regions) while sequentially shifting the center pixel concerned. Since the amount of pixel data after rasterizing becomes huge, performing complicated calculation processing in the raster data needs a dedicated hardware capable of high speed processing.

BRIEF SUMMARY OF THE INVENTION

According to one aspect of the present invention, a charged particle beam writing apparatus includes a storage device configured to store writing pattern data defining a plurality of figure patterns; detection circuitry configured to detect a figure portion whose shape needs to be corrected in the plurality of figure patterns, by interpreting shapes of the plurality of figure patterns; correction figure data generation circuitry configured to generate pattern data of a correction figure pattern for correcting the figure portion detected, where the pattern data includes dose information to identify a dose of the correction figure pattern; writing pattern data conversion circuitry configured to convert the writing pattern data of the plurality of figure patterns into writing pattern pixel data defining a value corresponding to a dose for each pixel; correction figure pattern data conversion circuitry configured to convert the pattern data of the correction figure pattern into correction figure pattern pixel data defining a value corresponding to a dose for the each pixel, based on pixel setting common to that of the writing pattern pixel data; combined-value pixel data generation circuitry configured to generate, for the each pixel, combined-value pixel data by adding the value defined in the writing pattern pixel data and the value defined in the correction figure pattern pixel data; and a writing mechanism configured to write, using a charged particle beam, a pattern on a target object such that the each pixel is irradiated with a beam of a dose corresponding to a value defined in the combined-value pixel data.

According to another aspect of the present invention, a charged particle beam writing method includes detecting a figure portion whose shape needs to be corrected in a plurality of figure patterns, by reading writing pattern data defining the plurality of figure patterns stored in a storage device, and interpreting shapes of the plurality of figure patterns; generating pattern data of a correction figure pattern for correcting the figure portion detected, where the pattern data includes dose information to identify a dose of the correction figure pattern; converting the writing pattern data of the plurality of figure patterns into writing pattern pixel data defining a value corresponding to a dose for each pixel; converting the pattern data of the correction figure pattern into correction figure pattern pixel data defining a value corresponding to a dose for the each pixel, based on pixel setting common to that of the writing pattern pixel data; generating, for the each pixel, combined-value pixel data by adding the value defined in the writing pattern pixel data and the value defined in the correction figure pattern pixel data; and writing, using a charged particle beam, a pattern on a target object such that the each pixel is irradiated with a beam of a dose corresponding to a value defined in the combined-value pixel data.

BRIEF DESCRIPTION OF THE DRAWINGS

FIG. 10A shows an example of a writing figure pattern according to the first embodiment;

FIGS. 10B and 10D show examples of pixel data according to the first embodiment;

FIG. 10C shows an example of a correction figure pattern according to the first embodiment;

FIGS. 12A to 12C show examples of combined-value pixels according to the first embodiment;

FIGS. 22A and 22B show examples of a dose distribution, writing figure, and correction figure after proximity effect correction according to the first embodiment.

DETAILED DESCRIPTION OF THE INVENTION

Embodiments below describe a writing apparatus and method which can correct local shape deviation of a writing pattern when performing writing with charged particle beams by using pixel data.

Embodiments below describe a configuration using an electron beam as an example of a charged particle beam. The charged particle beam is not limited to the electron beam, and other charged particle beam such as an ion beam may also be used. Although a multiple beam writing apparatus is described below, the writing apparatus is not limited to the one employing a multi-beam system. The writing apparatus may be the one employing a single beam, as long as it uses rasterized pixel data.

First Embodiment

Figure 1:
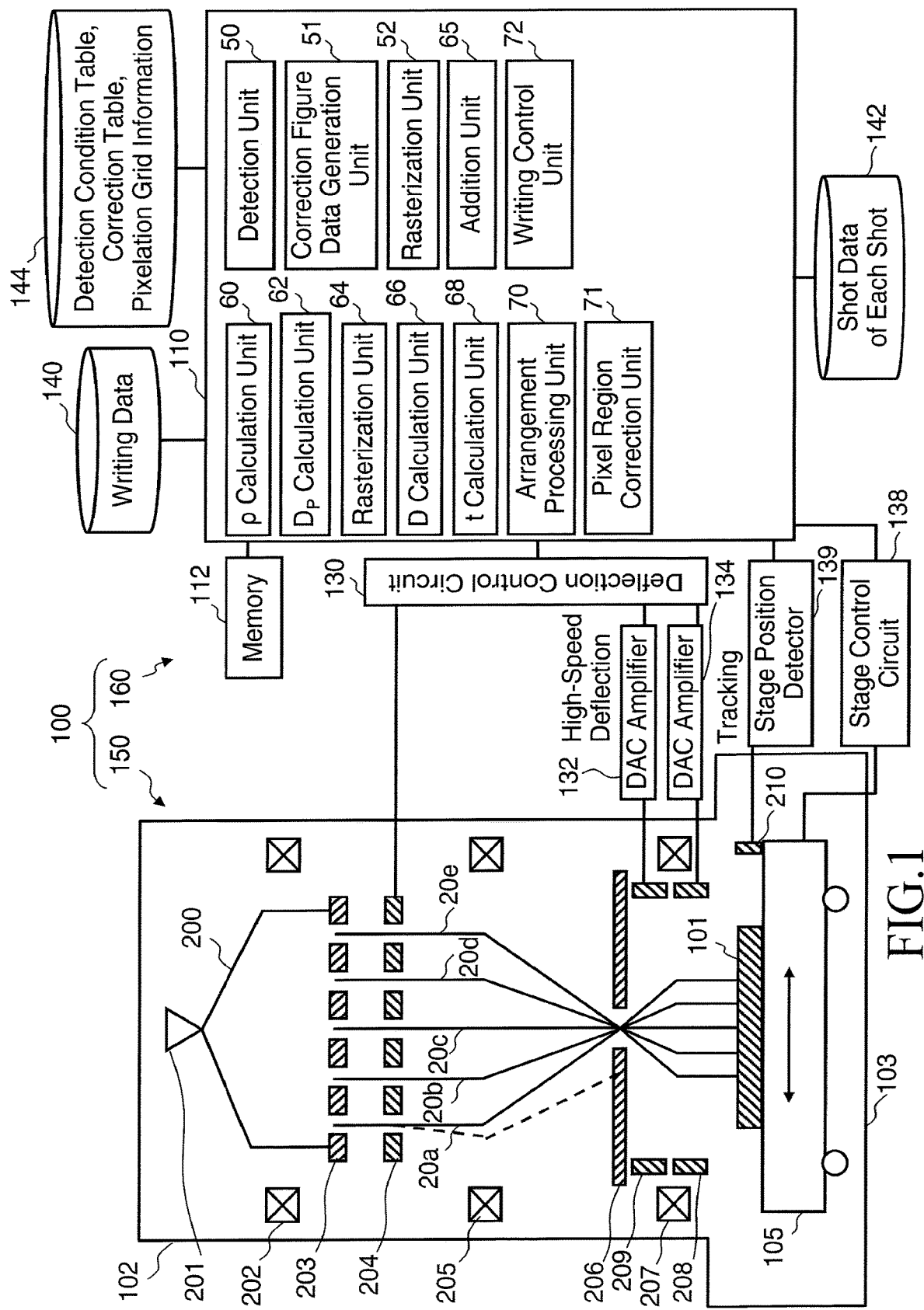
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control system circuit 160. The writing apparatus 100 is an example of a charged particle beam writing apparatus. The writing mechanism 150 includes an electron optical column 102 and a writing chamber 103. In the electron optical column 102, there are disposed an electron gun 201, an illumination lens 202, a shaping aperture array substrate 203, a blanking aperture array mechanism 204, a reducing lens 205, a limiting aperture substrate 206, an objective lens 207, and deflectors 208 and 209. In the writing chamber 103, an XY stage 105 is disposed. On the XY stage 105, a target object or "sample" 101 such as a mask serving as a writing target substrate is placed when writing is performed. The target object 101 is, for example, an exposure mask used for manufacturing semiconductor devices, or is a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 is arranged on the XY stage 105.

The control system circuit 160 includes a control computer 110, a memory 112, a deflection control circuit 130, DAC (digital-analog converter) amplifier units 132 and 134, a stage control circuit 138, a stage position detector 139, and storage devices 140, 142, and 144 such as magnetic disk drives. The control computer 110, the memory 112, the deflection control circuit 130, the stage control circuit 138, the stage position detector 139, and the storage devices 140, 142, and 144 are connected with each other through a bus (not shown). Writing data (writing pattern data) defining a plurality of figures is input from the outside of the writing apparatus 100 into the storage device 140 (storage unit) and stored therein. The deflection control circuit 130 is connected to the DAC amplifier circuits 132 and 134, and the blanking aperture array mechanism 204 through a bus (not shown). The stage position detector 139 irradiates the mirror 210 on the XY stage 105 with a laser beam, and receives a reflected light from the mirror 210. Then, the stage position detector 139 measures the position of the XY stage 105 by using information of the reflected light.

In the control computer 110, there are arranged a detection unit 50, a correction figure data generation unit 51, a rasterization unit 52, an area density calculation unit 60, a corrected irradiation coefficient calculation unit 62, a rasterization unit 64, an addition unit 65, a dose calculation unit 66, an irradiation time calculation unit 68, an arrangement processing unit 70, a pixel region correction unit 71 and a writing control unit 72. Each of the " . . . units" such as the detection unit 50, the correction figure data generation unit 51, the rasterization unit 52, the area density calculation unit 60, the corrected irradiation coefficient calculation unit 62, the rasterization unit 64, the addition unit 65, the dose calculation unit 66, the irradiation time calculation unit 68, the arrangement processing unit 70, the pixel region correction unit 71, and the writing control unit 72 includes processing circuitry. As the processing circuitry, for example, an electric circuit, computer, processor, circuit board, quantum circuit, or semiconductor device is used. Each " . . . unit" may use common processing circuitry (same processing circuitry), or different processing circuitries (separate processing circuitries). Information input and output to/from the detection unit 50, the correction figure data generation unit 51, the rasterization unit 52, the area density calculation unit 60, the corrected irradiation coefficient calculation unit 62, the rasterization unit 64, the addition unit 65, the dose calculation unit 66, the irradiation time calculation unit 68, the arrangement processing unit 70, the pixel region correction unit 71 and the writing control unit 72, and information being operated are stored in the memory 112 each time.

FIG. 1 shows a configuration necessary for describing the first embodiment. Other configuration elements generally necessary for the writing apparatus 100 may also be included therein.

Figure 2:
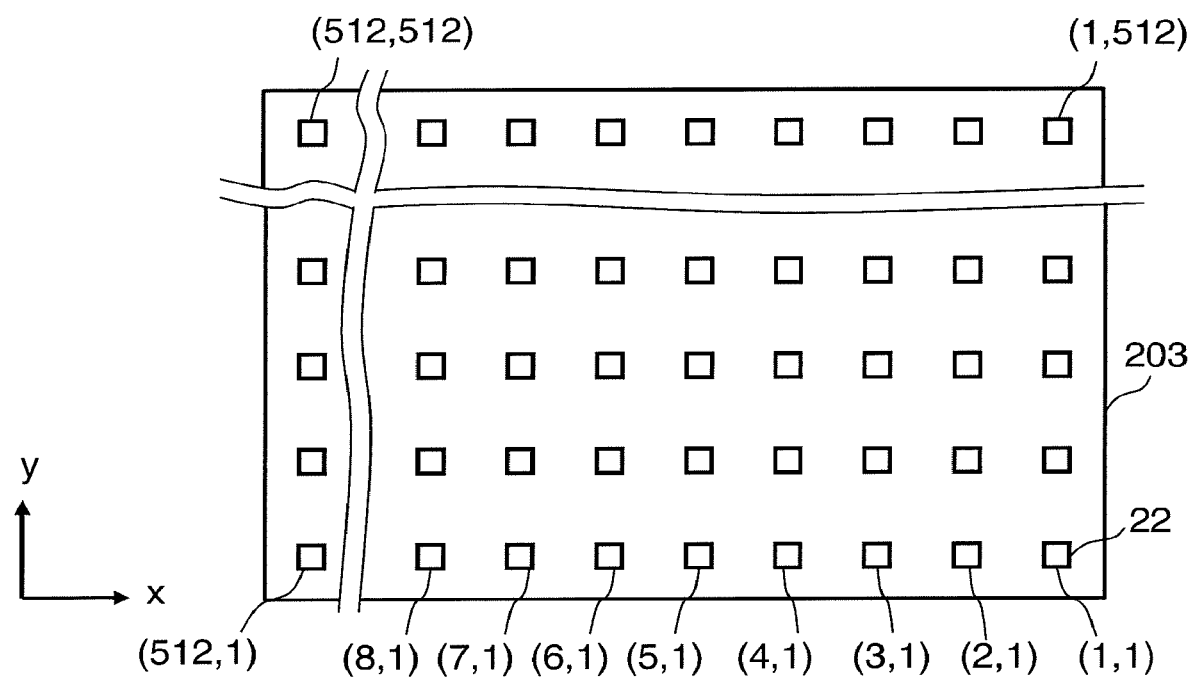
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of m rows long (length in the y direction) and n columns wide (width in the x direction) (m≥2, n≥2) are formed, like a matrix, at a predetermined arrangement pitch in the shaping aperture array substrate 203. In FIG. 2, for example, holes 22 of 512 (rows of holes arrayed in the y direction)×512 (columns of holes arrayed in the x direction) are formed. Each of the holes 22 is a rectangle (including a square) having the same dimension and shape. Alternatively, each of the holes 22 may be a circle with the same outer diameter. Multiple beams 20 are formed by letting portions of an electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. Moreover, the method of arranging the holes 22 is not limited to the case of FIG. 2 where holes are arranged in a grid form in the length and width directions. For example, with respect to the kth and the (k+1)th rows which are arrayed (accumulated) in the length direction (in the y direction) and each of which is in the x direction, each hole in the k-th row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2)th row may be mutually displaced in the width direction (in the x direction) by a dimension "b", for example.

Figure 3:
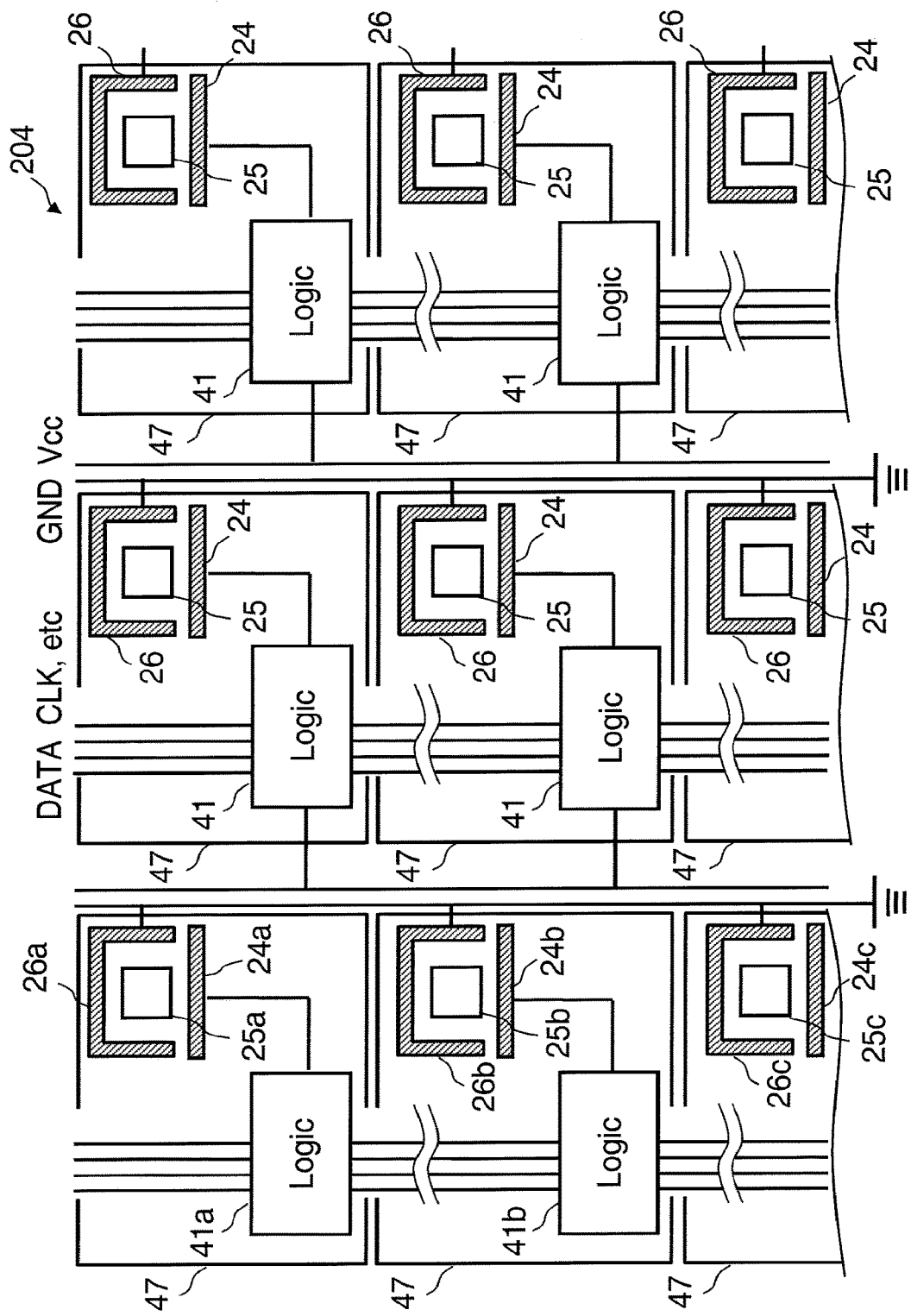
FIG. 3 is a top view conceptual diagram showing a part of a blanking aperture array mechanism according to the first embodiment.

FIG. 3 is a top view conceptual diagram showing a part of a blanking aperture array mechanism according to the first embodiment. In FIG. 3, the positional relation of electrodes 24 and 26 and that of a control circuit 41 are not in accordance with each other. As shown in FIG. 3, in the substrate of the blanking aperture array mechanism 204, there are formed passage holes 25 (openings), through which multiple beams individually pass, at the positions each corresponding to each hole 22 of the shaping aperture array member 203 of FIG. 2. Then, on the substrate of the blanking aperture array mechanism 204, a pair of electrodes 24 and 26 (blanker: blanking deflector) for blanking deflection is disposed close to a corresponding one of a plurality of passage holes 25 in a manner such that the electrodes 24 and 26 are opposite each other across the passage hole 25 concerned. Moreover, close to each passage hole 25, there is arranged the control circuit 41 (logic circuit) for applying a deflection voltage to, for example, the electrode 24 for each passage hole 25. The other one (the electrode 26, for example) of the two electrodes 24 and 26 for each beam is grounded (earthed). Further, for example, n-bit lines of a required number, for a control signal, is connected to each control circuit 41. In addition to the n-bit lines, for example, a clock signal line, a power source line, and the like are connected to each control circuit 41. An individual blanking mechanism 47 composed of the electrodes 24 and 26 and the control circuit 41 is configured for each beam of multiple beams. A control signal for each control circuit 41 is output from the deflection control circuit 130. Moreover, a shift register (not shown) is disposed in each control circuit 41, and for example, shift registers in the control circuits for beams in one row of n×m multiple beams are connected in series. For example, control signals for beams in one row of the n×m multiple beams are transmitted in series, and a control signal for each beam is stored in a corresponding control circuit 41 by clock signals of n times.

The electron beam passing through a corresponding passage hole 25 is independently deflected by the voltage applied to the paired electrodes 24 and 26. Blanking control is performed by this deflection. Blanking deflection is performed for each corresponding one of the multiple beams 20. Thus, each of a plurality of blankers performs blanking deflection of a corresponding one of the multiple beams 20 having passed through a plurality of holes 22 (openings) in the shaping aperture array substrate 203.

The electron beam 200 emitted from the electron gun 201 (emission unit) almost perpendicularly (e.g., vertically) illuminates the whole of the shaping aperture array substrate 203 by the illumination lens 202. A plurality of rectangular holes (openings) have been formed in the shaping aperture array substrate 203, and the region including all the plurality of holes 22 is irradiated with the electron beam 200. For example, a plurality of rectangular (including square) electron beams (multiple beams) 20a to 20e are formed by letting portions of the electron beam 200, which irradiates the positions of a plurality of holes 22, individually pass through a corresponding one of the plurality of holes 22 in the shaping aperture array substrate 203. The multiple beams 20a to 20e individually pass through a corresponding blanker (individual blanking mechanism) of the blanking aperture array mechanism 204. Each blanker provides deflection (performs blanking deflection) of the electron beam 20, individually passing, in order to make it become beam "on" during the period of calculated writing time (irradiation time) and become beam "off" during the period except for the calculated time.

The multiple beams 20a to 20e having passed through the blanking aperture array mechanism 204 are reduced by the reducing lens 205, and go toward the hole in the center of the limiting aperture substrate 206. At this stage, the electron beam 20, which was deflected to be beam "off" by the blanker of the blanking aperture array mechanism 204, deviates (shifts) from the hole in the center of the limiting aperture substrate 206 (blanking aperture member) and is blocked by the limiting aperture substrate 206. On the other hand, the electron beam 20, which was not deflected by the blanker of the blanking aperture array mechanism 204 or deflected to be beam "on", passes through the hole in the center of the limiting aperture substrate 206 as shown in FIG. 1. Blanking control is carried out by on/off of the individual blanking mechanism so as to control on/off of beams. Thus, the limiting aperture substrate 206 blocks each beam which was deflected to be in the "off" state by the individual blanking mechanism. Then, one shot beam is formed by a beam which has been made during a period from becoming beam "on" to becoming beam "off" and has passed through the limiting aperture substrate 206. The multiple beams 20 having passed through the limiting aperture substrate 206 are focused by the objective lens 207 so as to be a pattern image of a desired reduction ratio. Then, respective beams (the whole of the multiple beams 20) having passed through the limiting aperture substrate 206 are collectively deflected in the same direction by the deflectors 208 and 209 in order to irradiate respective writing positions (irradiation positions) on the target object 101. Ideally, the multiple beams 20 irradiating at a time are aligned at pitches obtained by multiplying the arrangement pitch of a plurality of holes in the shaping aperture array substrate 203 by the desired reduction ratio described above. The writing apparatus 100 performs a writing operation by a method of sequentially irradiating shot beams while shifting the writing position, and when writing a desired pattern, controls a beam required according to a pattern to be beam "on" by blanking control.

Figure 4:
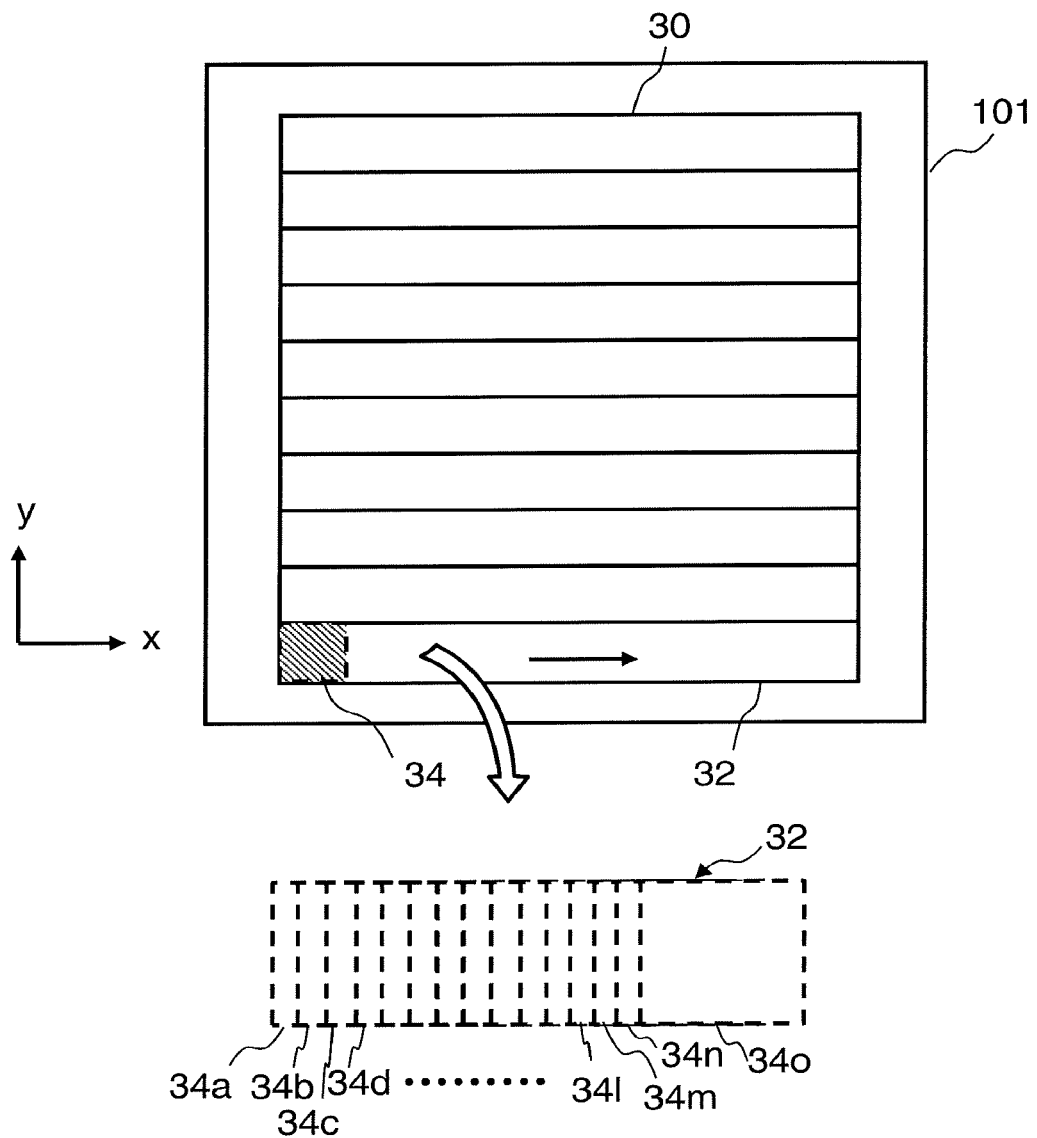
FIG. 4 is a conceptual diagram explaining an example of a writing operation according to the first embodiment.

FIG. 4 is a conceptual diagram explaining an example of a writing operation according to the first embodiment. In FIG. 4, the region of a chip pattern to be written on the target object 101 serves as a writing region 30 of the target object 101. In the case of a plurality of chips being simultaneously written, a merged chip pattern obtained by merging the plurality of chips into one chip serves as the writing region 30 of the target object 101. The writing region 30 is virtually divided into a plurality of stripe regions 32 each in the shape of a strip and each having a predetermined width in the y direction, for example. First, the XY stage 105 is moved to make an adjustment such that an irradiation region 34, which can be irradiated with one irradiation of the multiple beams 20, is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the writing position is moved in the y direction by the distance of the stripe region width, for example, and then the second stripe region is written. When writing the second stripe region 32, the XY stage 105 is moved, for example, in the +x direction, so that the writing may relatively proceed in the −x direction. The XY stage 105 is moved, for example, continuously at a constant speed. Similarly, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns, up to as many as the number of the holes 22, are formed at a time by one shot of multiple beams having been formed by passing through the holes 22 in the shaping aperture array substrate 203.

Figure 5:
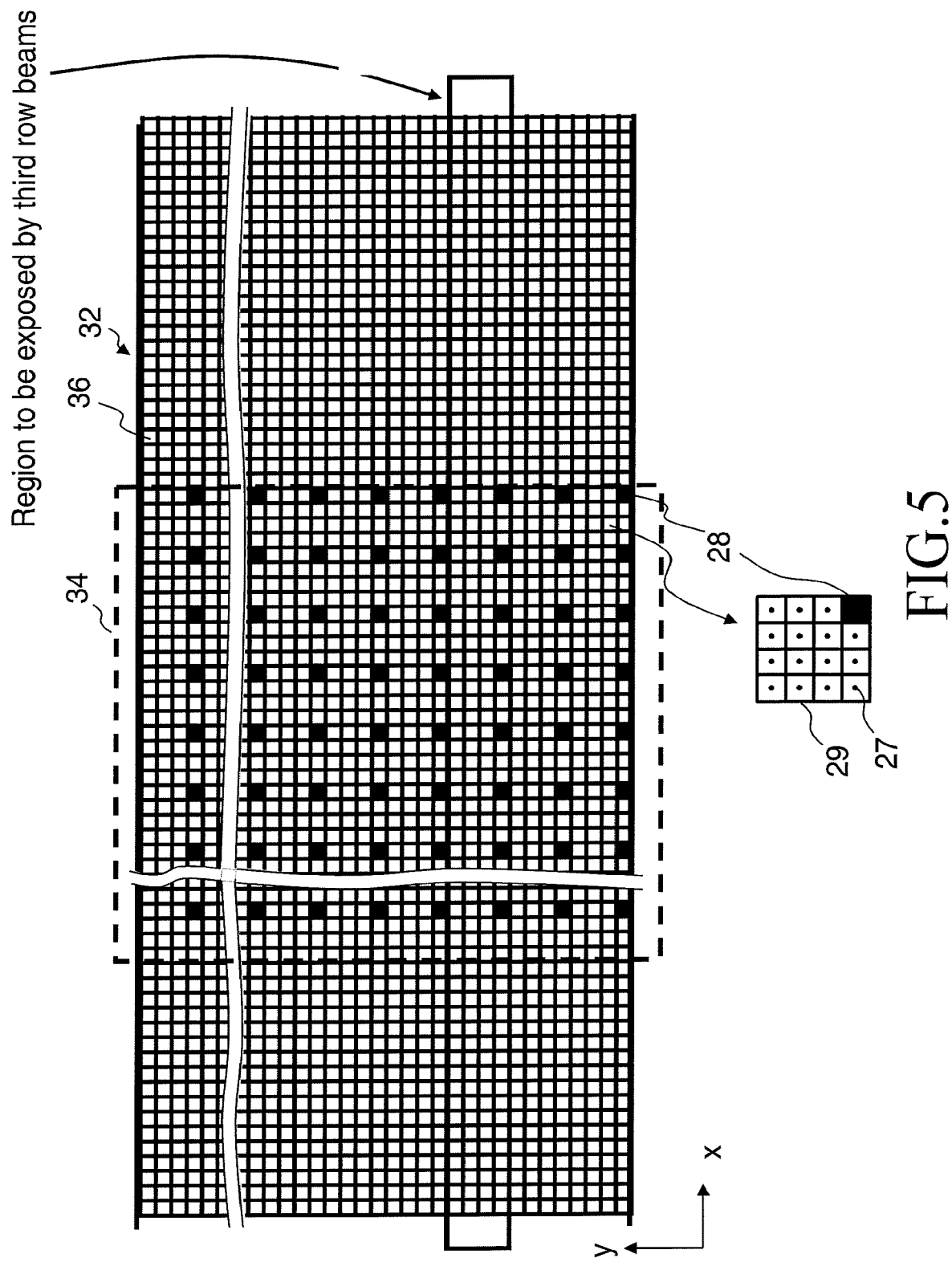
FIG. 5 shows an example of an irradiation region of multiple beams and a writing target pixel according to the first embodiment.

FIG. 5 shows an example of an irradiation region of multiple beams and a pixel to be written (writing target pixel) according to the first embodiment. In FIG. 5, in the stripe region 32, there are set a plurality of control pixels 27 (control grids) arranged in a grid form at the beam size pitch of the multiple beams 20 on the surface of the target object 101, for example. Preferably, they are arranged at an arrangement pitch of around 10 nm. A plurality of control pixels 27 serve as design irradiation positions of the multiple beams 20. The arrangement pitch of the control pixel 27 is not limited to the beam size, and may be an arbitrary size which can be controlled as a deflection position of the deflector 209 regardless of the beam size. For example, the beam size is set to be k times the arrangement pitch of the control pixels 27. However, if the beam size is smaller than the control pixel, the accuracy may be degraded, and if the beam size is extremely large compared to the control pixel size, the number of writing target pixels and the data amount may become excessive, thereby increasing the writing time. Therefore, k is preferably a real number from about 1 to about 5. For example, in response to the recent demand for accuracy, it is preferable to set about a 5 nm pixel with a 10 nm beam. A plurality of pixels 36 are set by being virtually divided into meshes each having the same size as the arrangement pitch of the control pixel 27 and centering on each control pixel 27. Hereinafter, the control pixel 27 is used meaning the central grid of the pixel 36.

Each pixel 36 serves as an irradiation unit region per beam of multiple beams. FIG. 5 shows the case where the writing region of the target object 101 is divided, for example, in the y direction, into a plurality of stripe regions 32 by the width size being substantially the same as the size of the irradiation region 34 (writing field) which can be irradiated with one irradiation of the multiple beams 20. The x-direction size of the irradiation region 34 can be defined by the value obtained by multiplying the pitch between beams in the x direction of the multiple beams 20 by the number of beams in the x direction. The y-direction size of the irradiation region 34 can be defined by the value obtained by multiplying the pitch between beams in the y direction of the multiple beams 20 by the number of beams in the y direction. The width of the stripe region 32 is not limited to this. By performing writing while collectively deflecting the multiple beams 20 and shifting the position of the irradiation region 34 of the multiple beams 20 in the y direction, the stripe region 32 having a wider width can also be written. Preferably, the width of the stripe region 32 is n times (n being an integer of 1 or greater) the size of the irradiation region 34. FIG. 5 shows the case of multiple beams of 512×512 (rows×columns) being simplified to 8×8 (rows× columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams 20. In the example of FIG. 5, one sub-irradiation region 29 (pitch region between beams) is a square region surrounded by four adjacent pixels 28 at four corners and including one of the four pixels 28. In the case of FIG. 5, each sub-irradiation region 29 is composed of 4×4(=16) pixels.

Figure 6:
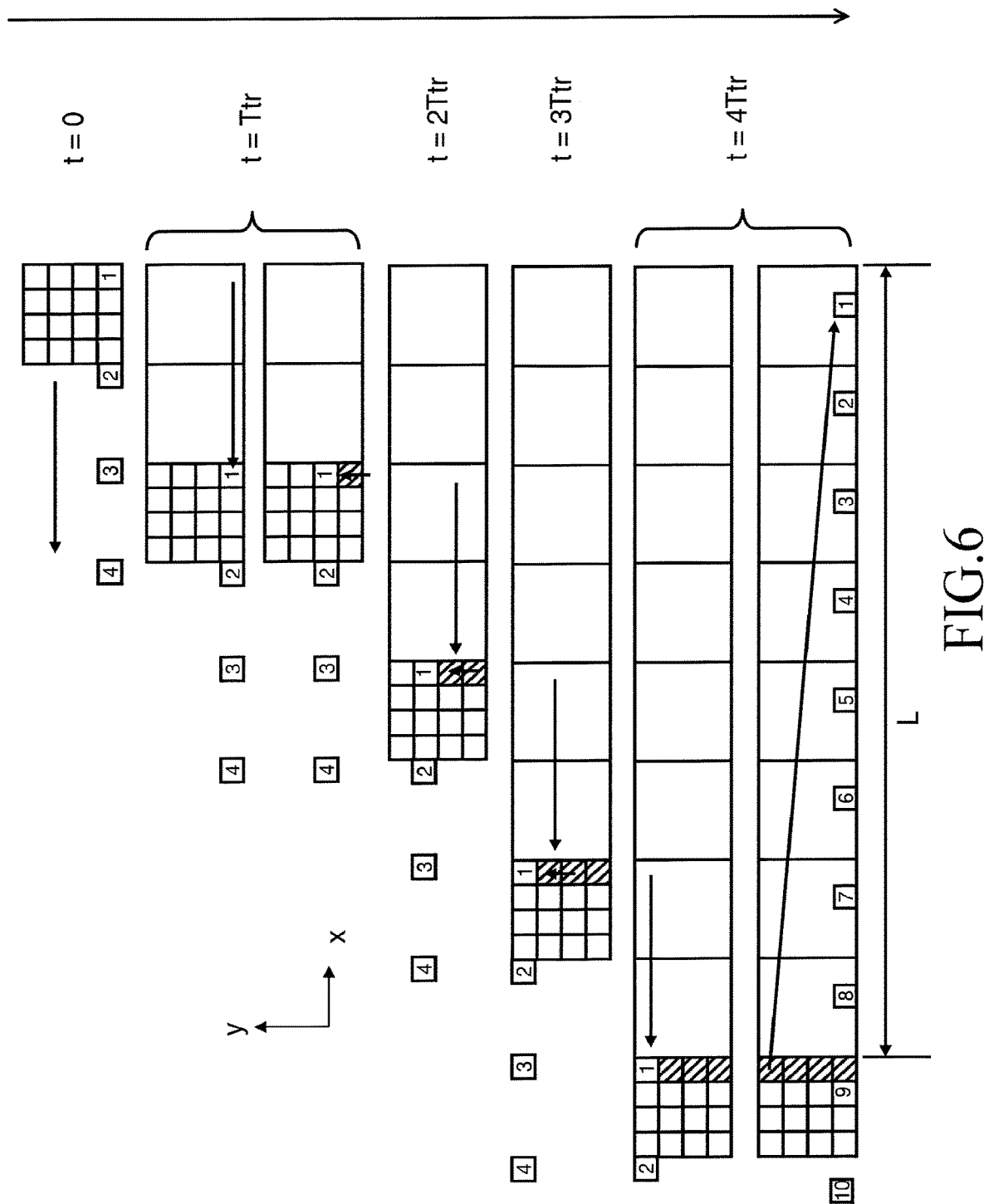
FIG. 6 illustrates an example of a writing method of multiple beams according to the first embodiment.

FIG. 6 illustrates an example of a writing method of multiple beams according to the first embodiment. FIG. 6 shows a portion of a grid to be written by each of beams at the coordinates (1, 3), (2, 3), (3, 3), . . . , (512, 3) in the third row from the bottom in the multiple beams for writing the stripe region 32 shown in FIG. 5. In the example of FIG. 6, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collective deflection of all the multiple beams 20 by the deflector 208. In other words, tracking control is performed. In the case of FIG. 6, one tracking cycle is executed by writing (exposing) four pixels while moving the distance of eight beam pitches.

Specifically, the stage position detector 139 measures the position of the XY stage 105 by irradiating the mirror 210 with a laser and receiving a reflected light from the mirror 210. The measured position of the XY stage 105 is output to the control computer 110. In the control computer 110, the writing control unit 72 outputs the position information on the XY stage 105 to the deflection control circuit 130. While being in accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier unit 134. The DAC amplifier unit 134 converts the digital signal to an analog signal and amplifies it to be applied as a tracking deflection voltage to the deflector 208.

The writing mechanism 150 irradiates each pixel 36 with a corresponding one of the multiple beams 20 during a writing time corresponding to the pixel 36 concerned within a maximum irradiation time Ttr of the irradiation time of each of the multiple beams in the shot concerned.

In the example of FIG. 6, the first pixel from the right in the bottom row of the sub-irradiation region 29 concerned is irradiated with the first shot of the beam (1) at coordinates (1, 3) during the time from t=0 to t=maximum irradiation time Ttr. The XY stage 105 moves two beam pitches in the −x direction during the time from t=0 to t=Ttr, for example. During this time period, the tracking operation is continuously performed.

After the maximum irradiation time Ttr of the shot has elapsed since the start of beam irradiation of the shot, while the beam deflection for tracking control is continuously performed by the deflector 208, the writing position (previous writing position) of each beam is shifted to a next writing position (current writing position) of each beam by collective deflection of the multiple beams 20 by the deflector 209, which is performed in addition to the beam deflection for tracking control. In the example of FIG. 6, when the time becomes t=Ttr, the target pixel to be written is shifted from the first pixel from the right in the bottom row of the sub-irradiation region 29 concerned to the first pixel from the right in the second row from the bottom. Since the XY stage 105 is moving at a fixed speed also during this time period, the tracking operation is continuously performed.

Then, while the tracking control is continuously performed, respective corresponding ones of the multiple beams 20 are individually applied to the shifted writing positions corresponding to the respective beams during a writing time corresponding to each of the respective beams within the maximum irradiation time Ttr of the shot concerned. In the example of FIG. 6, the first pixel from the right in the second row from the bottom of the sub-irradiation region 29 concerned is irradiated with the second shot of the beam (1) at the coordinates (1, 3) during the time from t=Ttr to t=2Ttr. The XY stage 105 moves, for example, two beam pitches in the −x direction during the time from t=Ttr to t=2Ttr. During this time period, the tracking operation is continuously performed.

In the example of FIG. 6, when the time becomes t=2Ttr, the target pixel to be written is shifted from the first pixel from the right in the second row from the bottom of the sub-irradiation region 29 concerned to the first pixel from the right in the third row from the bottom by collective deflection of the multiple beams by the deflector 209. Since the XY stage 105 is moving also during this time period, the tracking operation is continuously performed. Then, the first pixel from the right in the third row from the bottom of the sub-irradiation region 29 concerned is irradiated with the third shot of the beam (1) at the coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the target pixel to be written is shifted from the first pixel from the right in the third row from the bottom of the sub-irradiation region 29 concerned to the first pixel from the right in the fourth row from the bottom by collective deflection of the multiple beams by the deflector 209. Since the XY stage 105 is moving also during this time period, the tracking operation is continuously performed. The first pixel from the right in the fourth row from the bottom of the sub-irradiation region 29 concerned is irradiated with the fourth shot of the beam (1) at the coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. In this manner, writing of the pixels in the first column from the right of the sub-irradiation region 29 concerned has been completed.

In the example of FIG. 6, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 6, when the time becomes t=4Ttr, tracking of the sub-irradiation region 29 concerned is cancelled, and the beam is swung back to a new target sub-irradiation region 29 which has been shifted by eight beam pitches in the x direction. Although the beam (1) at the coordinates (1, 3) has been described in the example of FIG. 6, writing is also similarly performed for each sub-irradiation region 29 corresponding to a beam at other coordinates. That is, when the time becomes t=4Ttr, the beam at coordinates (n, m) completes writing of pixels in the first column from the right of a corresponding sub-irradiation region 29. For example, the beam (2) at coordinates (2, 3) completes writing of pixels in the first column from the right of the sub-irradiation region 29 adjacent in the −x direction to the sub-irradiation region 29 for the beam (1) of FIG. 6.

Since writing of the pixels in the first column from the right of each grid has been completed, in a next tracking cycle after resetting the tracking, the deflector 209 performs deflection such that the writing position of each corresponding beam is adjusted (shifted) to the second pixel from the right in the first row from the bottom of each grid.

As described above, in the state where the relative position of the irradiation region 34 to the target object 101 is controlled by the deflector 208 to be an unchanged position during the same tracking cycle, each shot of the pass concerned is carries out while performing shifting from one pixel to another pixel by the deflector 209. Then, after finishing one tracking cycle and returning the tracking position of the irradiation region 34, the first shot position is adjusted to the position shifted by one pixel, for example, and each shot is performed shifting from one pixel to another pixel by the deflector 209 while executing a next tracking control. By repeating this operation during writing the stripe region 32, the position of the irradiation region 34 is shifted consecutively, such as from 34a to 34o, to perform writing of the stripe region concerned as shown in the lower part of FIG. 4. The writing method is not limited to the example described above, and various methods can be thought. Such methods should be selected according to demand.

In the first embodiment, when a local partial shape of a figure pattern to be written deviates from the designed pattern, this partial shape is corrected.

Figure 7:
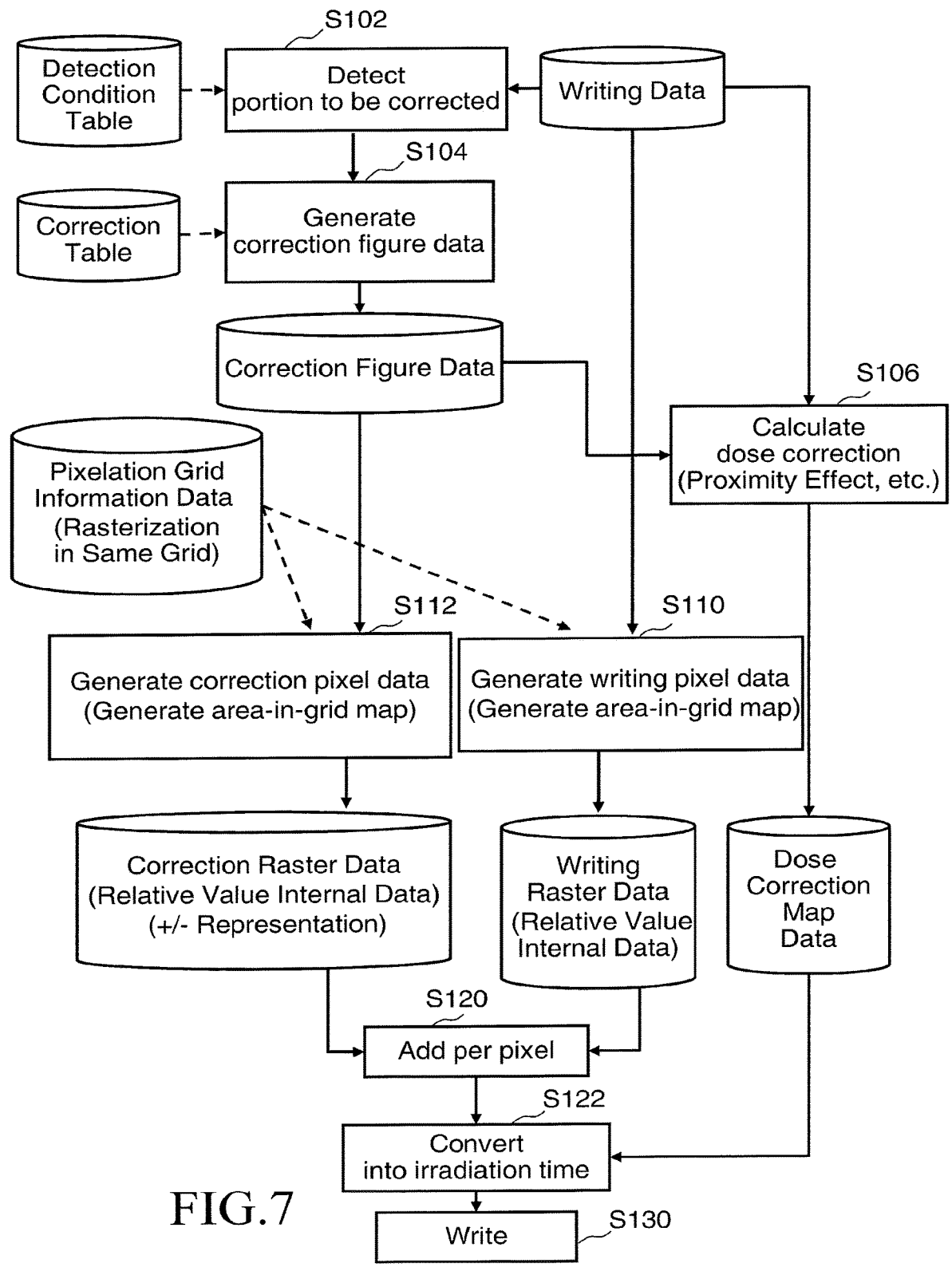
FIG. 7 is a flowchart showing main steps of a writing method according to the first embodiment.

FIG. 7 is a flowchart showing main steps of a writing method according to the first embodiment. In FIG. 7, the writing method of the first embodiment executes a series of steps: a portion-needing-correction detecting step (S102), a correction figure data generating step (S104), a dose correction calculating step (S106), a writing pixel data generating step (S110), a correction pixel data generating step (S112), a combining step (S120), an irradiation time data calculating step (S122), a writing step (S130).

By the writing method according to the first embodiment, writing in which deviation of the irradiation position of each beam has been corrected can be performed. In writing processing, although it is ideal that irradiation of each beam is delivered at a pre-set beam pitch, the beam irradiation position of each shot is actually deviated from a desired control pixel position due to distortion caused by various factors. As the factors of distortion, there are, for example, a deflection distortion (optical distortion) resulting from lens conditions and adjustment residual of a deflection amount, and a field distortion (transfer distortion) that theoretically exists due to design precision, installation position accuracy, etc. of the optical system parts. Moreover, besides these distortions, there may exist a distortion due to other factors. Thus, the beam irradiation position is deviated by distortion resulting from these factors, and therefore, a positional deviation and a shape accuracy degradation of a desired pattern may occur. Then, first, a positional deviation amount of the irradiation position of each of the multiple beams is measured beforehand. For example, after writing a figure pattern, which is independent per beam, onto the substrate coated with resist, developing and ashing are performed. Then, the amount of positional deviation from a design position can be calculated by measuring the position of each figure pattern with a position measuring instrument. Moreover, the positional deviation amount of the irradiation position of each beam can also be calculated by scanning a mark (not shown) on the XY stage 105 with a beam. The positional deviation data is stored in the storage device 144. For example, a distortion amount map in which distortion of each position in the irradiation region 34 due to positional deviation is mapped, and this distortion amount map is stored in the storage device 144. Alternatively, it is also preferable that a positional deviation amount of each position is fitted by a polynomial in order to acquire a distortion amount arithmetic expression, and the distortion amount arithmetic expression or the coefficient of this expression is stored in the storage device 144. Although the positional deviation in the irradiation region 34 of the multiple beams 20 is here measured, it is also preferable to further consider the influence of distortion (Z correction distortion) resulting from enlargement/reduction and rotation of an image in the case of dynamically adjusting (Z position correction) the focus position of a beam by unevenness of the writing surface of the target object 101. Since which beam of the multiple-beams 20 irradiates which control pixel 27, namely, which beam passing through a correspond opening 22 irradiates which control pixel 27 is determined based on the writing sequence, the deviation amount of each control pixel is determined by the deviation amount of a corresponding beam.

Figure 8:
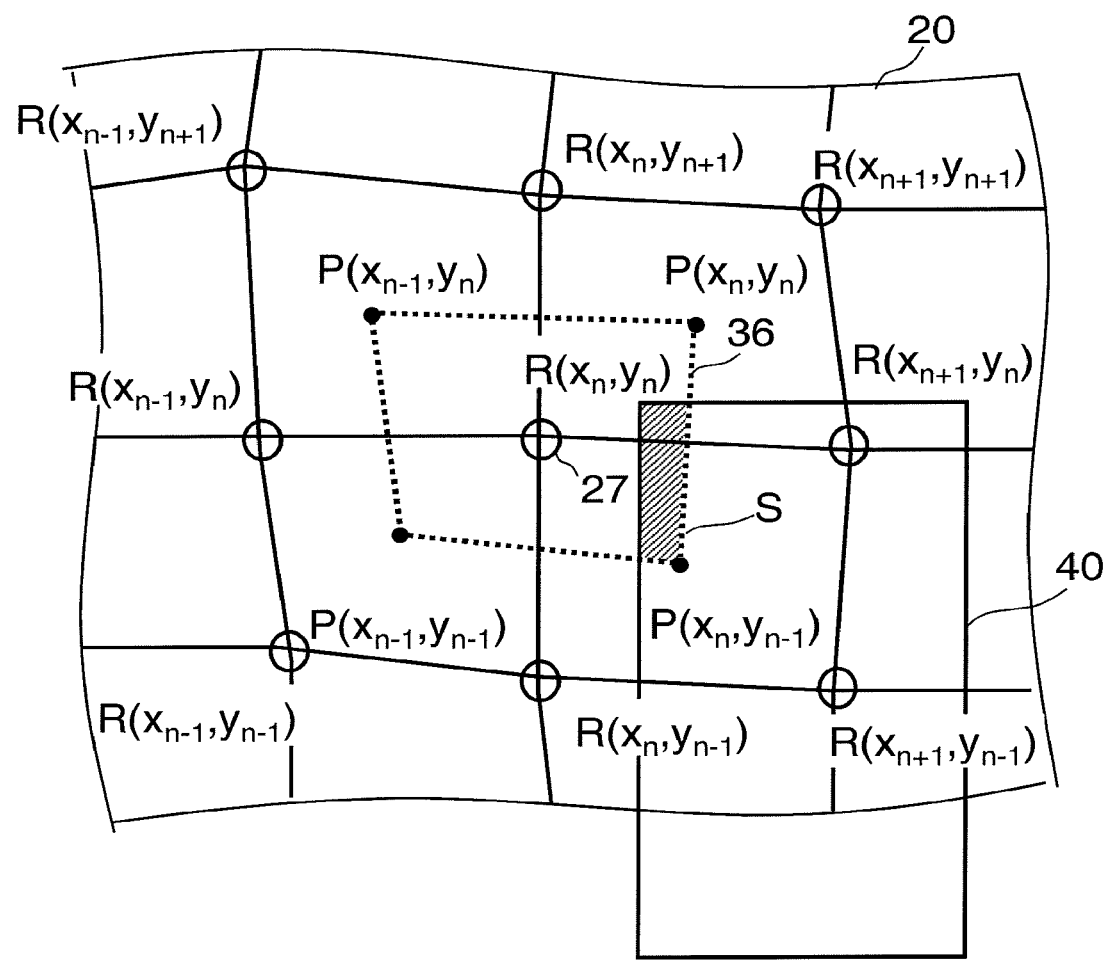
FIG. 8 illustrates a shift of a control pixel and the region of the pixel after the shift according to the first embodiment.

FIG. 8 illustrates a shift of a control pixel and the region of the pixel after the shift according to the first embodiment. In FIG. 8, the pixel region correction unit 71 inputs positional deviation data of each beam, and shifts, for each stripe region 32, the position of each control pixel 27(R) in the stripe region 32 concerned to the irradiation position of the beam associated after positional deviation, based on the positional deviation data. Then, the pixel region correction unit 71 variably sets the dose depending upon the positional deviation amount, and makes the resolution position of the pattern coincide with the original design position. In the example of FIG. 8, the region associated with each control pixel is transformed dependent on the deviation amount of the irradiation position of each beam. Thereby, the resolution position of a pattern matches the original design position by varying the dose sharing ratio between adjacent control pixels. With respect to a beam having no positional deviation, it is unnecessary to perform correction by shifting the control pixel 27 concerned. In the case where the irradiation position of each beam is not deviated from the design position, or where it is assumed there is no deviation, each control pixel 27(R) is an intersection of orthogonal grids composed of a plurality of orthogonal lines in two directions, and each pixel 36 is a rectangular region which is obtained by virtually dividing into meshes by the size equal to the arrangement pitch of the control pixel 27, and which centers on the corresponding control pixel 27. Thus, pixelation of a figure is performed based on pixelation grid (uniform grid) being uniform in the x and y directions. However, in the case of there being beam positional deviation, as shown in FIG. 8, distortion occurs in the shape of the grid of each control pixel 27(R). Then, the pixel region correction unit 71 changes the region of the pixel 36, depending upon the shift of the control pixel 27, in order to perform correction. In that case, in the example of FIG. 8, the center P of the region surrounded by close 2×2 control pixels Rs arranged in length and width is calculated. The region surrounded by four region centers Ps centering on the control pixel 27 is defined as the pixel 36 of the control pixel 27 concerned. In FIG. 8, with respect to the first quadrant of the region centering on the control pixel R ($x_n$, $y_n$) of the coordinates ($x_n$, $y_n$), it is possible to obtain the center P ($x_n$, $y_n$) of the region surrounded by the control pixel R ($x_n$, $y_n$), the control pixel R ($x_{n+1}$, $y_n$) the control pixel R ($x_{n+1}$, $y_{n+1}$)$_r$ and the control pixel R($x_n$, $y_{n+1}$). Similarly with respect to the second quadrant of the region centering on the control pixel R($x_n$, $y_n$), it is possible to obtain the center P($x_{n-1}$, $y_n$) of the region surrounded by the control pixel R($x_n$, $y_n$), the control pixel R($x_{n-1}$, $y_n$), the control pixel R($x_{n-1}$, $y_{n+1}$) and the control pixel R($x_n$, $y_{n+1}$). Similarly, with respect to the third quadrant of the region centering on the control pixel R ($x_n$, $y_n$), it is possible to obtain the center P($x_{n-1}$, $y_{n-1}$) of the region surrounded by the control pixel R($x_n$, $y_n$), the control pixel R($x_{n-1}$, $y_n$), the control pixel R($x_{n-1}$, $y_{n-1}$), and the control pixel R($x_n$, $y_{n-1}$). Similarly, with respect to the fourth quadrant of the region centering on the control pixel R($x_n$, $y_n$), it is possible to obtain the center P($x_n$, $y_{n-1}$) of the region surrounded by the control pixel R($x_n$, $y_n$), the control pixel R($x_{n+1}$, $y_n$), the control pixel R($x_{n+1}$, and the control pixel R ($x_n$, $y_{n-1}$). Therefore, the pixel 36 of the control pixel R($x_n$, $y_n$) is the region surrounded by the region centers P($x_n$, $y_n$), P($x_{n-1}$, $y_n$), P($x_{n-1}$, $y_{n-1}$), and P($x_n$, $y_{n-1}$). Thus, the pixel 36 is corrected from the rectangular shape to the deviated shape. The grid formed by the boundaries of the pixel 36 is a pixelation grid, and, in the case of FIG. 8, is a non-uniform pixelation grid (non-uniform grid) being non-uniform in the x and y directions.

By the procedure described above, the pixel region correction unit 71 generates pixelation grid information in which the region of each pixel 36 have been corrected based on the shift position of each control pixel 27. The generated pixelation grid information is stored in the storage device 144. The pixelation grid information may be previously generated offline at the outside of the writing apparatus 100, and stored in the storage device 144. With respect to the case of FIG. 8, which is an example of a non-uniform pixelation grid (non-uniform grid) being non-uniform in the x and y directions, since each pixel 36 is connected having no space, the gross area of a certain region in which the pixels with the non-uniform grid are connected is the same as that in the case of the certain region in which the pixels with a pixelation grid (uniform grid) being uniform in the x and y directions are connected. Although the entire doses for the entire regions are the same in both the cases, if using the non-uniform pixelation grid, it becomes possible to correct the dose deviation occurring along with the positional deviation of a beam irradiation position, thereby correcting pattern dimension errors and the like. Moreover, the pixelation grid information is not limited to this example, it may be determined according to the requirements.

In the portion-needing-correction detecting step (S102), the detection unit 50 reads writing data from the storage device 140, interprets the shapes of a plurality of figure patterns defined in the writing data, and detects a figure portion whose shape needs to be corrected in the plurality of the figure patterns. According to the first embodiment, the detection unit 50 previously estimates a shape deformation of a formed pattern after writing, and performs correction processing to correct the estimated deformation depending on the pattern shape by biasing the pattern edge, adding another pattern, and so on. In other words, in the first embodiment, a locally deformed figure pattern is corrected by shifting the resolution position of the pattern edge by locally adding a +/−dose. As examples of an assumed/ expected correction in electron beam writing, there may be corrections for linearity, short range proximity effect, corner R, line shortening, etc. The detection target is defined in a detection condition table. In the detection condition table, for example, the end portion of a line whose width is equal to or less than a prescribed line width is defined as a detection target for correction of line shortening. A line whose width is equal to or less than a prescribed line width is defined for correction of line width (linearity correction). A contact hole pattern equal to or less than a prescribed dimension is defined as a detection target for correction of corner R of a contact hole pattern. A figure, the distance between which and the adjacent figure is equal to or less than a prescribed value, is defined as a detection target for correction of short range proximity effect. The detection condition is not limited to these, and it may be set such that the shapes of various figure arrangement in need of correction are detected. The detection condition table is stored in advance in the storage device 144.

Instead of detecting a correction target figure, it is also possible to perform simulation, etc. though it takes much processing time. For example, it is also preferable to detect, through simulation, a portion where the shape change equal to or more than a prescribed value has occurred.

Figure 9:
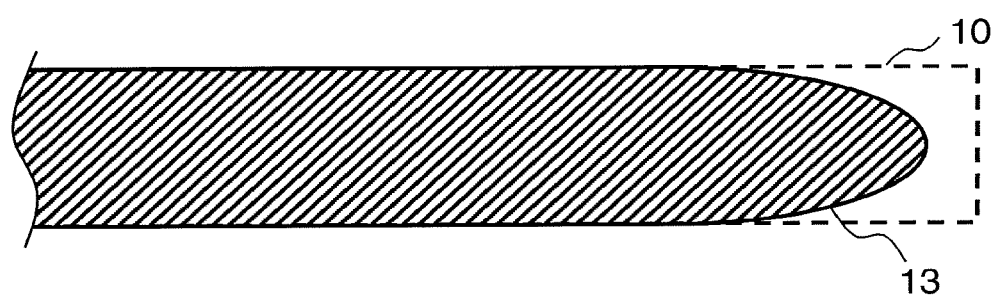
FIG. 9 shows an example of a figure portion serving as a correction target according to the first embodiment.

FIG. 9 shows an example of a figure portion serving as a correction target according to the first embodiment. In FIG. 9, there is shown an example of the end portion of a line whose width is equal to or less than a prescribed line width defined in a detection condition table. If a line (line pattern 10) is written based on writing data as shown in FIG. 9, a phenomenon (line shortening) occurs in that the end portion of a written line (line pattern 13) tapers to a point and shortens due to various process conditions, etc. In the first embodiment, the shape of the end portion is corrected as an example.

In the correction figure data generating step (S104), the correction figure data generation unit 51 generates pattern data of a correction figure pattern for correcting a detected figure portion, where the pattern data includes dose information to identify the dose of the correction figure pattern. The correction figure pattern is generated with reference to a correction table. In the correction table, with respect to a figure portion which is assumed to have been deformed and which is to be detected as a detection target, the arrangement position, figure type, size, and correction dose (gradation level) of a correction figure pattern used for correcting the deformation are defined. For example, through a prior evaluation experiment, there are determined the detection conditions of the shape (line width, pitch, shape, etc. of a writing figure) which needs to be corrected, and the arrangement position, figure type, size, and correction dose (gradation level) of a correction figure, based on the shape and dimension of a figure portion to be detected. Then, related to the shape and size of a figure portion to be detected, the arrangement position, figure type, size, and correction dose (gradation level) of the correction figure are defined in the correction table. Alternatively, through simulation, etc., the optimal arrangement position, figure type, size, and correction dose (gradation level) of a correction figure are adjustingly determined. However, if simulation, etc. is performed each time, the processing amount increases. Therefore, the correction table needs to be prepared in advance. In the data of a correction figure pattern to be generated based on the correction table, there are described/defined the position, shape (figure type and size) of a figure, and information (correction dose) including ±gradation level. In other words, in the pattern data of a correction figure pattern to be generated, shape data of the correction figure pattern, and plus or minus dose information corresponding to the contents of correction are defined. At this time, it is convenient to represent the correction dose of the correction figure pattern by a relative value to the reference dose (criterion dose) of a normal writing pattern. Here, if the correction figure pattern data uses a typical graphical representation format based on required correction accuracy, which is to be described later, it is avoided to perform detailed figure definition less than the resolution limit in electron beam writing. Moreover, at this time, the original figure data and the correction figure pattern data are separately maintained. Even when generating correction figure pattern data based on a plurality of conditions, the original figure data remains maintained as it is, and only correction figure pattern data based on each condition is additionally generated. Thus, data amount increase can be prevented and therefore, it is easy to perform data management. According to the first embodiment, the writing data and the pattern data of a correction figure pattern are stored, as separate files, in the storage device. In the case of FIG. 1, writing data is stored in the storage device 140, and pattern data of a correction figure pattern is stored in the storage device 144.

FIG. 10A shows an example of a writing figure pattern, FIGS. 10B and 10D show examples of pixel data, and FIG. 10C shows an example of a correction figure pattern, according to the first embodiment. FIG. 10A shows a region which centers on the end portion (figure portion) of the line pattern 10 being a writing target. When converting, by rasterizing, the end portion (figure portion) of the line pattern 10 into pixel data, as shown in FIG. 10B, the value "100" indicating a dose of 100% is defined for each of the pixels in the line pattern 10, and the value "0" indicating a dose of 0% is defined for each of the pixels outside the line pattern 10. Preferably, the dose is defined by a relative value, ratio, or percentage standardized based on the criterion that the reference (or base) dose is regarded as 100 (alternatively, 1 or 10). In the example of FIG. 10B, a relative value based on the criterion that the reference dose is regarded as 100 is defined. However, if writing processing is performed in this situation as it is, the end portion of the line pattern 10 tapers to a point and shortens as explained with reference to FIG. 9. With respect to this shape change, as shown in FIG. 10C, the correction figure data generation unit 51 generates, using the correction table, two small rectangular correction figure patterns 12a at the positions a little short of the end portion of the line pattern 10 to be overlapping with both sides of the line edge, and a rectangular correction figure pattern 12b at the position partially overlapping with the end portion of the line pattern 10. As for each of the two correction figure patterns 12a, a minus correction dose is defined. On the other hand, as for the correction figure pattern 12b, a plus correction dose is defined. In the example of FIG. 10C, the value "−10" indicating a dose of −10% is defined for each of the two correction figure patterns 12a, and the value "+20" indicating a dose of +20% is defined for the correction figure pattern 12b. If the correction figure pattern of FIG. 10C is rasterized, it is converted into the pixel arrangement as shown in FIG. 10D. Then, the pixels of FIGS. 10B and 10D are added to be used for writing. Preferably, the correction dose is defined by a relative value, ratio, or percentage standardized based on the criterion that the reference dose is regarded as 100 (alternatively, 1 or 10). In the example of FIG. 10C, a relative value based on the criterion that the reference dose is regarded as 100 is defined.

Figures 11A, 11B:
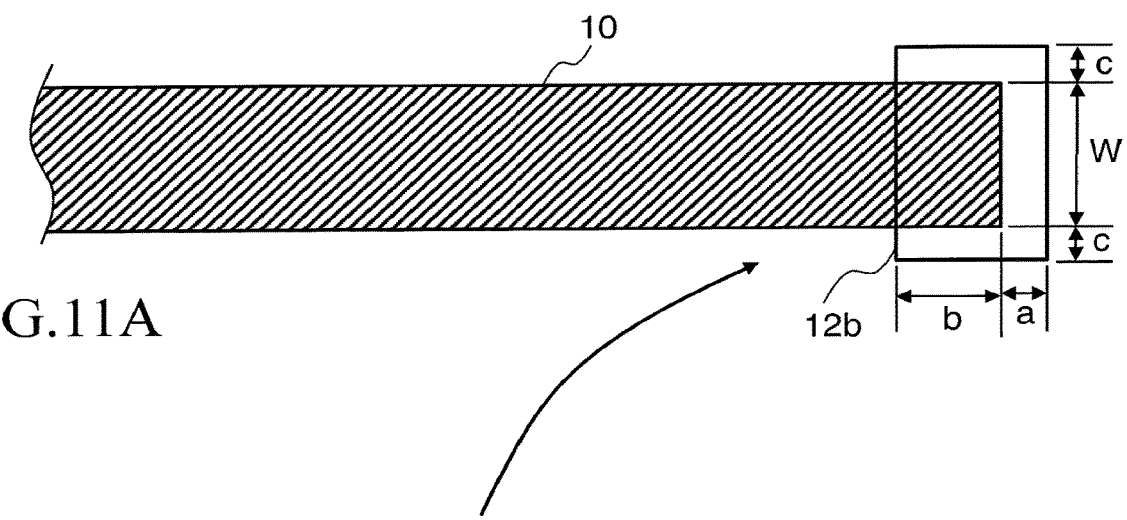
FIG. 11A shows an example of a writing line pattern and a correction figure pattern according to the first embodiment.
FIG. 11B shows an example of a correction table according to the first embodiment.

FIG. 11A shows an example of a writing line pattern and a correction figure pattern according to the first embodiment, and FIG. 11B shows an example of a correction table, according to the first embodiment. FIG. 11A shows the end portion of the writing line pattern 10, and a correction figure pattern 12b partially overlapping with the end portion of the line pattern 10. The two correction figure patterns 12a at the positions a little short of the end portion of the line pattern 10 to be at both sides of the line edge shown in FIG. 10C are not described. When arranging the correction figure pattern 12b, the arrangement position, size, and correction dose of the correction figure pattern 12b are determined referring to a correction table 11. Here, it is assumed that the figure type of the correction figure pattern 12b is previously set to be a rectangle. In the correction table 11, as shown in FIG. 11B, each size for determining the arrangement position and shape of the correction figure pattern 12b is defined, where the size is variably set depending on the line width W of the line pattern 10. In the case of FIG. 11B, in the correction table 11, there are defined "a" which protrudes, in the extending direction of the line pattern 10, from the end portion of the line pattern 10, "b" which overlaps with the end portion of the line pattern 10 to be overlapping from the edge to the internal side of the line pattern 10, "c" which protrudes, in the line width direction of the line pattern 10, from the line edge (side for determining the line width) of the end portion of the line pattern 10, and a correction dose. Moreover, an identifier indicating being data for correcting line shortening is defined in the correction table 11. Although the case of the line width W of the line pattern 10 being 30 to 60 nm is shown in the example of FIG. 11B, it should be understood that similar definition is performed with respect to other line widths. Moreover, in the example of FIG. 11B, the size of the correction figure pattern is defined for every 10 nm of the line width W of the line pattern 10. With respect to the line width of an intermediate value, it can be obtained, using defined data, by linear interpolation of the size of the correction figure pattern.

In the dose correction calculating step (S106), first, the area density calculation unit 60 (ρ calculation unit) virtually divides the writing region (here, for example, stripe region 32) into a plurality of proximity mesh regions (mesh regions for proximity effect correction calculation) by a predetermined size. The size of the proximity mesh region is preferably set to be about 1/10 to 1/30 of the influence range of the proximity effect, such as about 1 μm. The ρ calculation unit 60 reads writing data from the storage device 140 and data of a generated correction figure pattern. Then, the ρ calculation unit 60 overlaps, for each proximity mesh region, a writing figure pattern arranged in the proximity mesh region concerned and a correction figure pattern, and calculates a pattern area density ρ of a pattern arranged in the proximity mesh region concerned. Here, in the case of a correction figure pattern, the area of the figure is obtained by multiplying the area of the figure by the gradation level (+ or − standardized correction dose).

Next, the corrected irradiation coefficient calculation unit 62 ($D_p$ calculation unit) calculates, for each proximity mesh region, a proximity-effect corrected irradiation coefficient $D_p(x)$ (correction dose) for correcting a proximity effect. The proximity-effect corrected irradiation coefficient $D_p(x)$ can be defined by a threshold value model where a back-scatter coefficient η, a dose threshold value Dth of the threshold value model, and a distribution function $g_p(x)$ are used. The calculation method may be the same as the one used in a conventional method. The calculated proximity-effect corrected irradiation coefficient $D_p(x)$ is temporarily stored in the storage device 144 as a map data specifying the proximity-effect corrected irradiation coefficient Dp(x) (dose correction coefficient) for each mesh.

In the writing pixel data generating step (S110), the rasterization unit 64 (writing pattern data conversion unit) converts pattern data of a plurality of figure patterns into writing pattern pixel data defining a value corresponding to a dose for each pixel. Specifically, it operates as follows:

First, the writing control unit 72 associates, for each stripe region 32, each control pixel 27 in the stripe region 32 concerned with a beam related to each control pixel 27 concerned, in accordance with the writing sequence. The writing control unit 72 inputs pixelation grid information generated beforehand from the storage device 144, and associates the position of each control pixel 27 with the position of a pixelation grid.

Next, the rasterization unit 64 reads writing data from the storage device 140, and calculates, for each control pixel 27, a pattern area density p' of the pixel 36 of the control pixel 27 concerned. In that case, the rasterization unit 64 calculates, for each control pixel 27, the pattern area density ρ' of a plurality of writing figure patterns defined in writing data of the pixel 36 of the control pixel 27 concerned, using the position of each control pixel 27 and the region of each pixel 36 defined in pixelation grid information stored in the storage device 144. In the case of FIG. 8, an area density S of a figure pattern 40 arranged in the pixel 36 of the control pixel R ($x_n$, $y_n$) is calculated to be regarded as a pattern area density ρ'. That is, the area (relative value) of the portion where the region of the pixel 36 and the figure pattern 37 overlap with each other is the area density S. In that case, if there are a plurality of figures related to the pixel 36 concerned, the pattern area density ρ' is calculated for each figure, and all of them are added to obtain the pattern area density ρ' of the pixel 36 concerned. Preferably, the pattern area density ρ' is calculated as a relative value (e.g., 100%) on the basis of the pixel region area of a uniform pixelation grid (uniform grid) which has no deviation and is uniform in the x and y directions. In the case of using a non-uniform grid, since the pixel region may be larger than that of the case using a uniform grid, the pattern area density ρ' obtained after the calculation may exceed 100%. Thus, dimension deviation and the like of a pattern to be written occurring along with the positional deviation of the beam irradiation position can be corrected by obtaining the pattern area density ρ' by correcting the region of each pixel 36 based on the shift position of each control pixel 27. Normally, since an individual dose (gradation level) for each figure is not set in the writing data, the pattern area density ρ' represents a standardized dose. If there is writing data in which an individual dose (gradation level) for each figure is set, what is obtained by multiplying the figure pattern area density ρ' by a standardized dose (gradation level) of the figure concerned is regarded as a standardized dose, and then, the standardized doses of figures related to the pixel 36 concerned are added to obtained a standardized dose of the pixel 36 concerned. The standardized dose (dose coefficient) is represented by a relative value, ratio, or percentage standardized based on the criterion that the reference dose is regarded as 100 (alternatively, 1 or 10).

As described above, in the example of FIG. 10B, in the writing pattern pixel data, the value "100" indicating a dose of 100% is defined for each of the pixels in the line pattern 10, and the value "0" indicating a dose of 0% is defined for each of the pixels outside the line pattern 10. FIG. 10B shows the case where there is no deviation of the irradiation position of each beam, and the line edges of both the sides of the line pattern 10 coincide with the contour of a pixel, in the pixelation grid information. The writing pattern pixel data serves as writing pattern raster data being a series of pixel data.

In the correction pixel data generating step (S112), the rasterization unit 52 (correction figure pattern data conversion unit) converts pattern data of a correction figure pattern into correction figure pattern pixel data defining a value corresponding to the dose for each pixel, based on the pixel setting common to the writing pattern pixel data. Specifically, it operates as follows: The rasterization unit 52 calculates, for each control pixel 27, an area density ρ" of a correction figure pattern defined in the data of a correction figure pattern in the pixel 36 of the control pixel 27 concerned, using the position of each control pixel 27 and the region of each pixel 36 defined in pixelation grid information. In the case of FIG. 8, an area density S of the figure pattern 40 arranged in the pixel 36 of the control pixel R($x_n$, $y_n$) is calculated to be regarded as the area density ρ". Preferably, the pattern area density ρ" is calculated as a relative value (e.g., 100%) on the basis of the pixel region area of a uniform pixelation grid (uniform grid) which has no deviation and is uniform in the x and y directions. Thus, dimension deviation and the like of a pattern to be written occurring along with the positional deviation of the beam irradiation position can be corrected by obtaining a pattern area density by correcting the region of each pixel 36 based on the shift position of each control pixel 27.

Next, the rasterization unit 52 calculates, for each control pixel 27, a standardized dose (value corresponding to dose) by multiplying the calculated area density ρ" of the correction figure pattern by a correction dose of the correction figure pattern concerned. The standardized dose (dose coefficient) is indicated by a relative value, ratio, or percentage value standardized based on the criterion that the reference dose is regarded as 100 (alternatively, 1 or 10). If there are a plurality of correction figures related to the pixel 36 concerned, the rasterization unit 52 calculates a standardized dose of the control pixel 27 by calculating the pattern area density ρ" for each correction figure, calculating a standardized dose (value corresponding to dose) by multiplying the area density ρ" of each correction figure pattern by a correction dose of the correction figure pattern concerned, and adding standardized doses of related correction figures. As shown in FIGS. 10B and 10D, zero or a plus value is defined in the each pixel in the writing pattern pixel data, and a minus value may be defined in at least one pixel in the correction figure pattern pixel data.

When converting, by rasterizing, the correction figure patterns 12a and 12b shown in FIG. 10O into pixel data, the value "−10" indicating a dose of −10% is defined for each of the pixels in the two correction figure patterns 12a, and the value "20" indicating a dose of +20% is defined for each of the pixels in the correction figure pattern 12b as shown in FIG. 10D. Moreover, since the size of the correction figure pattern 12b is assumed to be overlapping with pixels at the upper and lower sides by, for example, 50%, the value "10" indicating a dose of +10% is defined for each of the adjacent pixels at the upper and lower outside of the end portion of the line pattern 10. FIG. 10D shows the case where there is no deviation of the irradiation position of each beam in the pixelation grid information. The correction figure pattern pixel data serves as correction figure pattern raster data being a series of pixel data.

When converting a writing figure and a correction figure into pixel data (that is, when generating raster data), there is a method of generally using a pixelation grid being uniform in x and y directions on the writing surface, and performing pixelation (rasterization using a uniform grid) by obtaining a figure area in the grid. Consequently, raster data of the pixel size, being the same in the x and y directions, is generated. However, according to the first embodiment, in order to highly accurately correct deviation of the irradiation position of each beam by using the multiple beams 20, when converting a writing figure and a correction figure into pixel data (that is, when generating raster data), the pixelation grid information explained with reference to FIG. 8 is used for both the figures. Deviation of the irradiation position of each beam can be corrected by performing writing using writing raster data generated by pixelation in accordance with a variable pixelation grid which is set depending on deviation of a beam irradiation position. As explained with reference to FIG. 8, corresponding to deviation of the irradiation position of a beam, pixelation (rasterization) is performed using a pixelation grid which is set to be non-uniform in x and y directions on the writing surface. In that case, the area in each grid is calculated and pixelated based on information specifying the grid position, (that is rasterization using non-uniform grid). In such a case, since the sizes of the pixels are not equal to each other, complicated processing is needed for correction processing on the pixel data like the conventional one, or even if disregarding the non-uniformity of a pixelation grid, sufficient accuracy cannot be obtained, resulting in correction inaccuracy of positional deviation, degradation of resolution performance, etc. According to the first embodiment, even in the case of performing rasterization using a pixelation grid which is non-uniform in x and y directions as described above, or in the case of a uniform grid, since it is possible to perform writing by generating a correction figure pattern using the same format as that of writing data, and generating correction raster data by the same rasterization processing as that for normal writing, writing can be efficiently executed without any additional complicated processing system and additional resource.

Besides, correction deviation due to grid position deviation can be avoided by using the same grid position information. According to the first embodiment, a correction figure pattern used for shape correction and a writing pattern are rasterized by using the same pixelation grid information, and, then, for performing writing, writing raster data is generated by carrying out addition and subtraction between raster data of the writing pattern and raster data of the correction figure pattern for each pixel. Thus, by executing rasterization using the same pixelation grid, a pattern for shape correction is generated as writing data whether the pixelation grid is a uniform grid or a non-uniform grid. Since, in performing rasterization, correction raster data is generated based on the same pixelation grid information as that of a writing pattern, no positional deviation occurs in both the patterns of the writing data and the shape correction data, thereby performing correction writing with great precision.

In view of operation management of the writing apparatus 100, it is necessary to maintain data having been used for writing or to be used for writing. If maintaining it as pixel data, the data amount becomes huge, thereby being unrealistic. Therefore, it is convenient for data management to maintain data of a correction figure pattern separately from writing data. When the data is maintained individually (separately), if the correction shape changes due to change of process conditions and the like, only the correction figure pattern which has changed in accordance with the situation change needs to be stored individually, because storing several types of correction figure patterns with writing data is unnecessary, and the writing data can be maintained as it is. Therefore, the data amount can be suppressed and data attribution (whether being original design data) is clear, thereby being convenient to manage. Further, when writing data being the original figure data has a hierarchical structure, since the data of the original figure can be maintained as it is and the hierarchical structure of the original figure data can be maintained by using the method of the first embodiment, it is possible, by performing correction, to avoid data amount increase due to breaking of the hierarchical structure. As described in the first embodiment, to maintain the correction data separately from other data indicates to maintain the difference between the original figure data and the figure data being a correction result (result of combining), as correction data (correction figure pattern data). Maintaining the difference data, as correction data, to be separated from other data is realized by displaying +/−gradation level in graphical representation. Thus, the method of the first embodiment makes it possible to separately have difference data as correction data, and therefore, processing can be efficiently executed, avoiding increase of the data amount. It should be understood that if the same or similar data compression method as that for writing data is used for correction data, the data amount can further be reduced.

In the combining step (S120), the addition unit 65 (combined-value pixel data generation unit) generates, for each pixel, combined-value pixel data by adding values defined in the writing pattern pixel data and the correction figure pattern pixel data. According to the first embodiment, there is a case where a pixel exists (a pixel is included) for which a value smaller than the value defined in the writing pattern pixel data before combining is defined as a value defined in the combined-value pixel data.

FIGS. 12A to 12C show examples of combined-value pixels according to the first embodiment. FIG. 12A shows writing pattern pixel data of the region close to the edge portion of the line pattern 10 shown in FIG. 10B. FIG. 12B shows correction figure pattern pixel data of the region close to the correction figure patterns 12a and 12b shown in FIG. 10D, where the region close to the correction figure patterns 12a and 12b is the region close to the edge portion of the line pattern 10. FIG. 12C shows a state of addition of a pixel value for each pixel as follows: The value "90" indicating a dose of 90%, where the dose has decreased in spite of being inside the line pattern 10, is defined in the pixels at some portions of both the sides of the line edge a little short of the end portion of the line pattern 10. The value "120" indicating a dose of 120%, where the dose has increased, is defined in the pixels inside the end portion of the line pattern 10. The value "20" indicating a dose of 20%, where the dose has increased in spite of being outside the line pattern 10, is defined in the adjacent pixels at the right outside of the end portion of the line pattern 10. The value "10" indicating a dose of 10%, where the dose has increased in spite of being outside the line pattern 10, is defined in the adjacent pixels at the upper and lower outside of the end portion of the line pattern 10.

As described above, the addition unit 65 generates combined-value pixel data (raster data for writing), which is actually to be used, by pixelating original figure data and shape correction data based on common pixelation grid position information, and adding (or subtracting) the doses of the writing pattern pixel data and the correction figure pattern pixel data, with respect to each writing pixel. Although subtraction is performed in the case of a correction figure of minus gradation level, as long as the correction figure is arranged accurately, the calculation result is not a minus value. If a minus value is generated due to a minute calculation error, it should be treated as 0 to be no problem.

In the irradiation time data calculating step (S122), first, the dose calculation unit 66 (D calculation unit) calculates, for each control pixel 27, a dose D(x) for irradiating the pixel 36 of the control pixel 27 concerned. Dose D(x) can be obtained by multiplying a reference dose, a proximity-effect corrected irradiation coefficient $D_p(x)$, and a ratio to the reference dose, which is indicated by a pixel value defined in the combined-value pixel data.

Next, the irradiation time calculation unit 68 calculates the irradiation time of a beam that irradiates each control pixel 27. The irradiation time t of a beam can be obtained by dividing the dose D(x) of the beam irradiating each control pixel 27 by the current density J. The current density J can be calculated by dividing a beam current value by a specified beam size.

Data of the irradiation time t of a beam irradiating each control pixel 27 is rearranged in order of shot by the arrangement processing unit 70. The irradiation time data (shot data) of each control pixel 27 rearranged in order of shot is temporarily stored in the storage device 142.

In the writing step (S130), the writing mechanism 150 performs writing, using multiple beams 20 (electron beams), a pattern on the target object 101 such that each control pixel 27 (or pixel 36) is irradiated with the beam dose corresponding to the value defined in the combined-value pixel data.

Figure 13A:
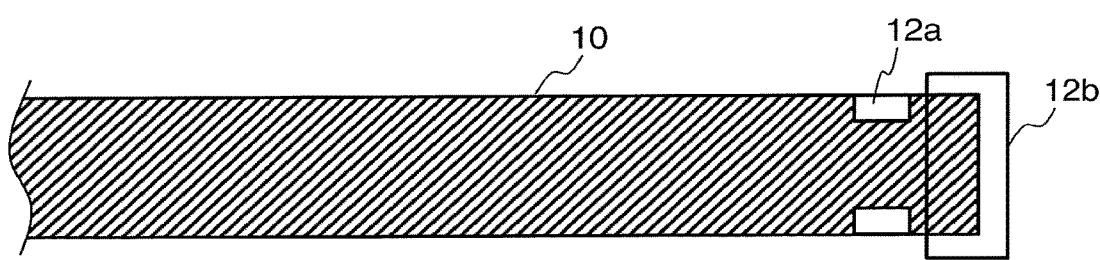
FIGS. 13A and 13B show other examples of a line pattern and a correction figure pattern according to the first embodiment.
Figure 13B:
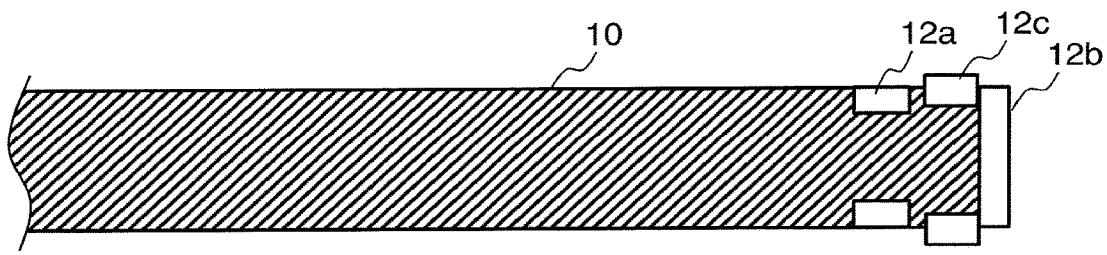

FIGS. 13A and 13B show other examples of the line pattern and the correction figure pattern according to the first embodiment. For correcting partial deformation of a figure pattern, there are methods of performing correction by changing the dose level, and of performing correction so as to change the shape of the figure. In FIG. 13A, by arranging the correction figure pattern 12b, a correction dose is added to change the dose level in the region of the end portion of the line pattern 10. In this correction, the deformation amount is corrected using a correction dose (gradation level) based on a conversion difference ΔL/Δ dose (resolution position change/dose change). In the example of FIG. 13A, as a correction figure pattern for correcting a figure portion of the line pattern 10, a correction figure pattern 12b (first correction figure pattern) for which plus dose information is defined, and a correction figure pattern 12a (second correction figure pattern) for which minus dose information is defined are arranged closely to each other. In order to prevent the line width from enlarging due to overcorrection by the correction figure pattern 12b (that is, in order to correct overcorrection), as shown in the figure, the two correction figure patterns 12a being minus dose figures are arranged close to the correction figure pattern 12b. Thus, correction is performed by individually appropriately arranging a gray figure (correction figure pattern 12b) of +/−gradation level to be in accordance with the correction shape. Particularly, according to the first embodiment, it is also possible to correct an overcorrected part which is due to addition of correction figure.

On the other hand, in FIG. 13B, the correction figure pattern 12b is formed such that the writing figure becomes larger by the size changed. A figure having the gradation level of a 100% correction dose and the correcting dimensional amount is formed as a correction figure. Moreover, in order to correct the taper, a correction figure pattern 12c of plus gradation level is arranged at the end portion of the line pattern 10. If a correction figure of minus gradation level is arranged at the end portion of the line pattern 10 serving as a writing figure, it is also possible to correct the line width to be reduced. Thus, also in the case of performing correction so as to change the shape of the figure, as a correction figure pattern for correcting a figure portion of the line pattern 10, the correction figure pattern 12b (first correction figure pattern) for which plus dose information is defined, and the correction figure pattern 12a (second correction figure pattern) for which minus dose information is defined are arranged closely to each other. In other words, in FIG. 13B similarly to FIG. 13A, the two correction figure patterns 12a being minus dose figures are arranged to prevent the line width from enlarging due to overcorrection (that is, to correct overcorrection).

Figure 14A:
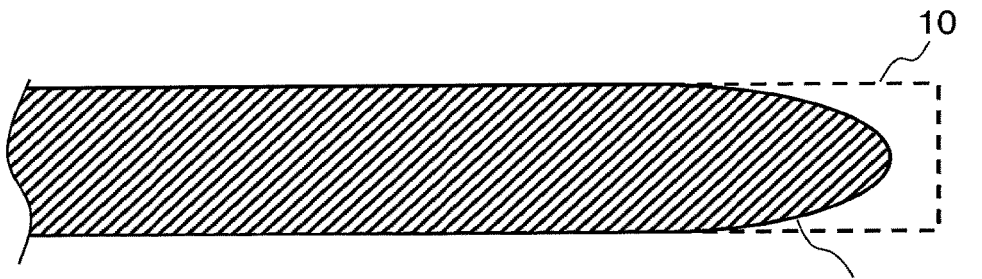
FIGS. 14A to 14D are for describing effects of a correction figure according to the first embodiment.
Figure 14B:
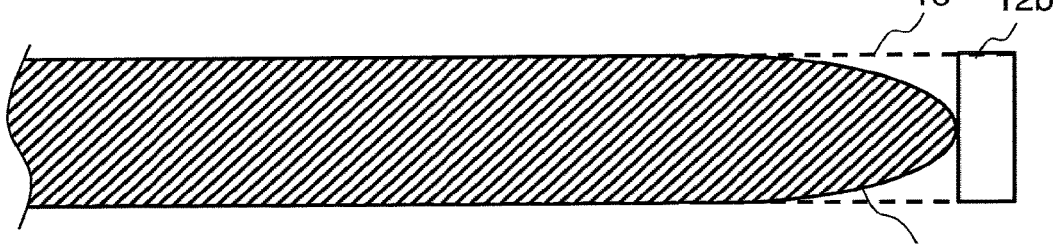
Figure 14C:
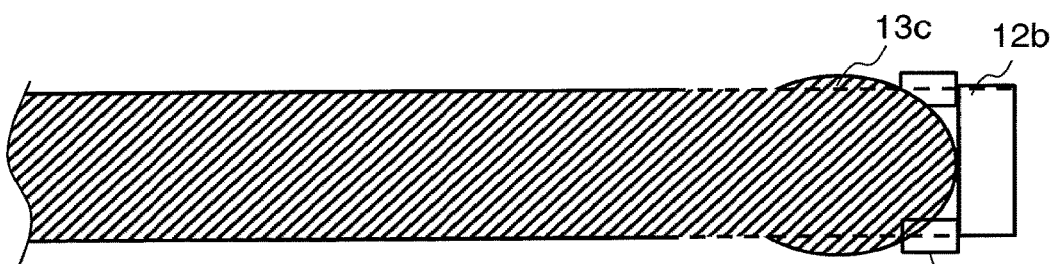
Figure 14D:
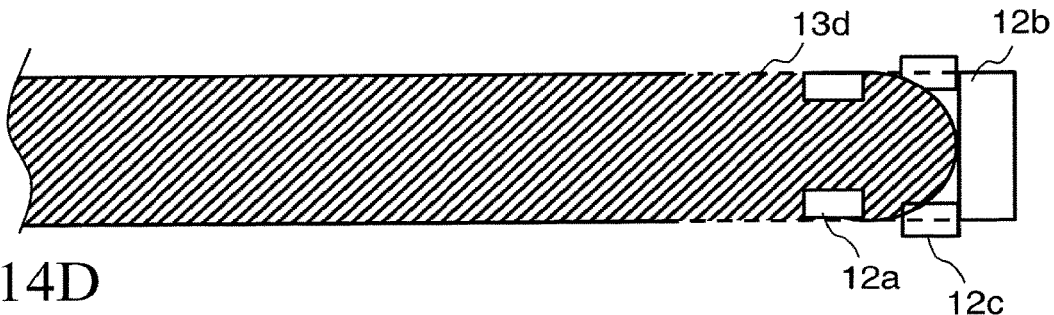

FIGS. 14A to 14D are for describing effects of a correction figure according to the first embodiment. In the case where the line pattern 10 having a line width equal to or less than a prescribed one is written, as shown in FIG. 14A, the end portion of the line pattern 10 tapers to a point and shortens as depicted by a line pattern 13a. To this shape change, the correction figure pattern 12b is arranged such that the writing figure becomes larger by the size changed. By this, as shown in FIG. 14B, the length becomes equivalent to the design value although the tapering at the end portion of the line pattern 10 still remains. Next, in order to correct the taper at the end portion, the correction figure patterns 12c of plus correction dose (gradation level) are arranged at the both sides of the end portion of the line pattern 10. By this, as shown in FIG. 14C, although the taper at the end portion of the line pattern 10 is corrected, overcorrection causing protrusion from the line width occurs. Then, the correction figure patterns 12a of minus correction dose (gradation level) are arranged at the portions protruding from the line width. Thereby, as shown in FIG. 14D, the overcorrection of the portion protruding from the line width can be corrected. Thus, it is possible to shift the resolution position of a pattern edge while maintaining the dose resolution, by contactingly adding/placing a correction figure which has a line width enough to be shifted, or adding/placing a figure of minus gradation level so that the line width of the writing figure may be reduced. In such a case, the correction can be performed without having process tolerance deterioration along with deterioration of dose resolution. With respect to a correction figure table, similarly to the example shown in FIG. 11B, it is sufficient to generate a table for arrangement information and a correction dose (gradation level) of a correction figure pattern for each dimension of the line width. In that case, for correcting an intermediate dimension of the line width, determination such as determining the correction amount in proportion to the line width is performed similarly to the example shown in FIG. 11B.

The size, position, gradation level, etc. of the correction figure for each dimension of the line width is determined in advance by experiment or simulation. With respect to the method of reducing the dose, it is necessary to carefully arrange the correction figure in order not to make a final dose a minus value.

Now, as a simplified method, it is also possible to perform correction by increasing the line width by uniformly adding a dose to the whole region of the end portion of the line pattern 10 having been deformed (thinner and shorter than the design), (which can be called a region correction). However, in view of arrangement of a correction figure, correction is performed only by increasing the correction dose. In such a case, the deformation amount is corrected by determining a correction amount based on a conversion difference ΔL/Δ dose (resolution position change/dose change) against the necessary dose for the original process. Since shape deformation is dependent on the dimension, the amount of correction also depends on the dimension. Therefore, as described in the example of the correction figure table, the correction figure can be specified by the size of shape, positional relation, and dose with respect to the dimension. In the case of the line width being the intermediate dimension of dimensions defined by the table, processing such as interpolation in proportion to the line width may be performed for the dimension of a correction figure and the dose. Although this method of uniformly adding the dose is simple, since process tolerance deterioration may occur along with deterioration of the dose resolution at the pattern edge portion, correction by this method is preferably restricted to a small amount, in consideration of accuracy.

Figures 15A, 15B:
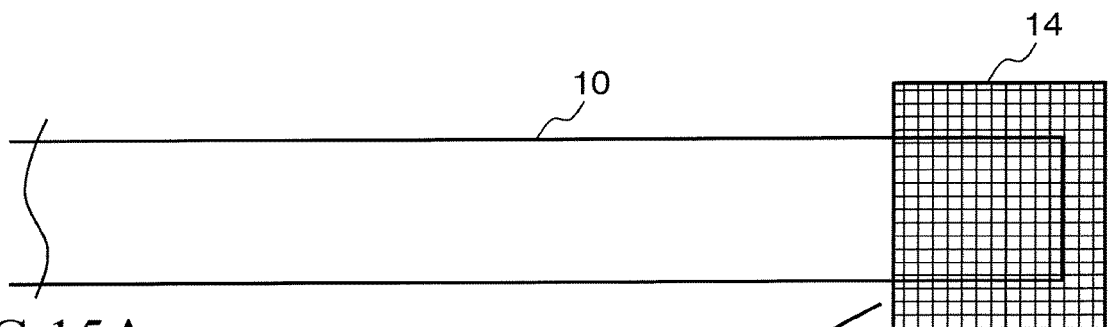
FIGS. 15A and 15B show other examples of a line pattern and a correction figure pattern according to the first embodiment.

FIGS. 15A and 15B show other examples of the line pattern and the correction figure pattern according to the first embodiment. In FIG. 15A, using a correction figure pattern 14 whose region shape includes the end portion of the line pattern 10, the correction dose is increased or decreased so that the dose level in the region of the end portion of the line pattern 10 may be changed for each small region. Regarding the correction figure pattern 14 of FIG. 15A, dose information for each small region which is obtained by dividing the correction figure into meshes is defined in pattern data of the correction figure pattern 14 as shown in FIG. 15B. In other words, the correction figure pattern 14 is formed as a gray (gradation) map figure. In FIG. 15B, the dose information of at least one of the plurality of small regions is for identifying a minus dose, for example. Representing the gradation per small region is hereinafter called a gray (gradation) map figure. An arbitrary corrected irradiation shape can be formed by setting the arrangement position, mesh size, and correction dose (gradation level) of a gray map figure for correction with respect to the line pattern 10 being a figure to be corrected, and by controlling the dose for each small mesh region. When performing correction using a gray map, it is preferable to set the mesh size to be about equal to or smaller than the pixel 36 so as not to degrade the resolution. In the correction table in the case of performing correction using a gray map, since the correction shape changes depending on the dimension, it should not be performed to interpolate simply in proportion to the dimension. Then, for example, the correction for each dimension can be executed by setting, for each dimension range, a gray map figure for correction (that is, setting arrangement position, mesh size, and gradation level of a gray map figure for correction with respect to a figure to be corrected), and performing scaling, including the mesh size, based on the dimension while keeping the correction dose (gradation level) as it is in the dimension range concerned. The dimension range to be set becomes minute at its connection portion, so that an error can be within a predetermined one. When scaling, more detailed setting is executed by performing setting to also change the correction dose (gradation level) depending on the dimension, where the processing contents may be appropriately set depending on a demand (demanded throughput and demanded accuracy). Preferably, a concrete set value is determined through experiment or simulation.

Figures 16A, 16B:
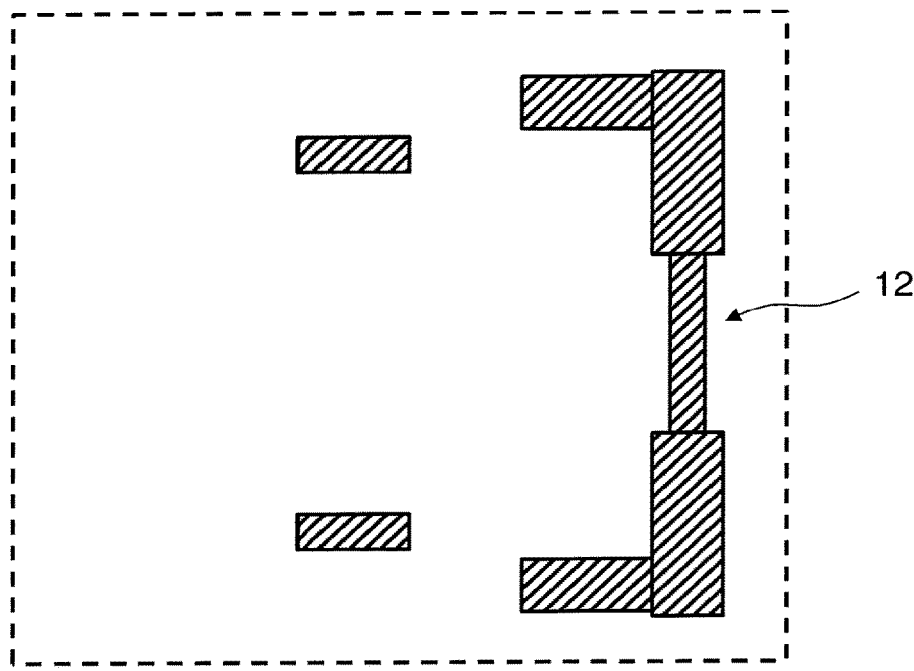
FIG. 16A shows an example of a gray map correction figure according to the first embodiment.
FIG. 16B shows an example of a rectangular correction figure corresponding to a gray map correction figure according to the first embodiment.

FIG. 16A shows an example of a gray map correction figure, and FIG. 16B shows an example of a rectangular correction figure corresponding to the gray map correction figure, according to the first embodiment. FIG. 16A shows the correction figure pattern 14 generated based on the gray map figure of FIG. 15B. If approximately representing the correction figure pattern 14 by using rectangular correction figures while restricting the number of the figures, it becomes the correction figure pattern 12 being a combination of rectangular figures of a plurality of sizes as shown in FIG. 16B. If setting a correction dose, to be minute equivalent to a gray map figure, by combining rectangular figures, it is necessary to make the rectangular pattern have around the mesh size of the gray map figure, which results in increase of the data amount. If a gray map figure is used, the data amount increase can be suppressed compared to the case of defining the correction dose by using minute figures. Which to use is dependent on required accuracy.

Figure 17:
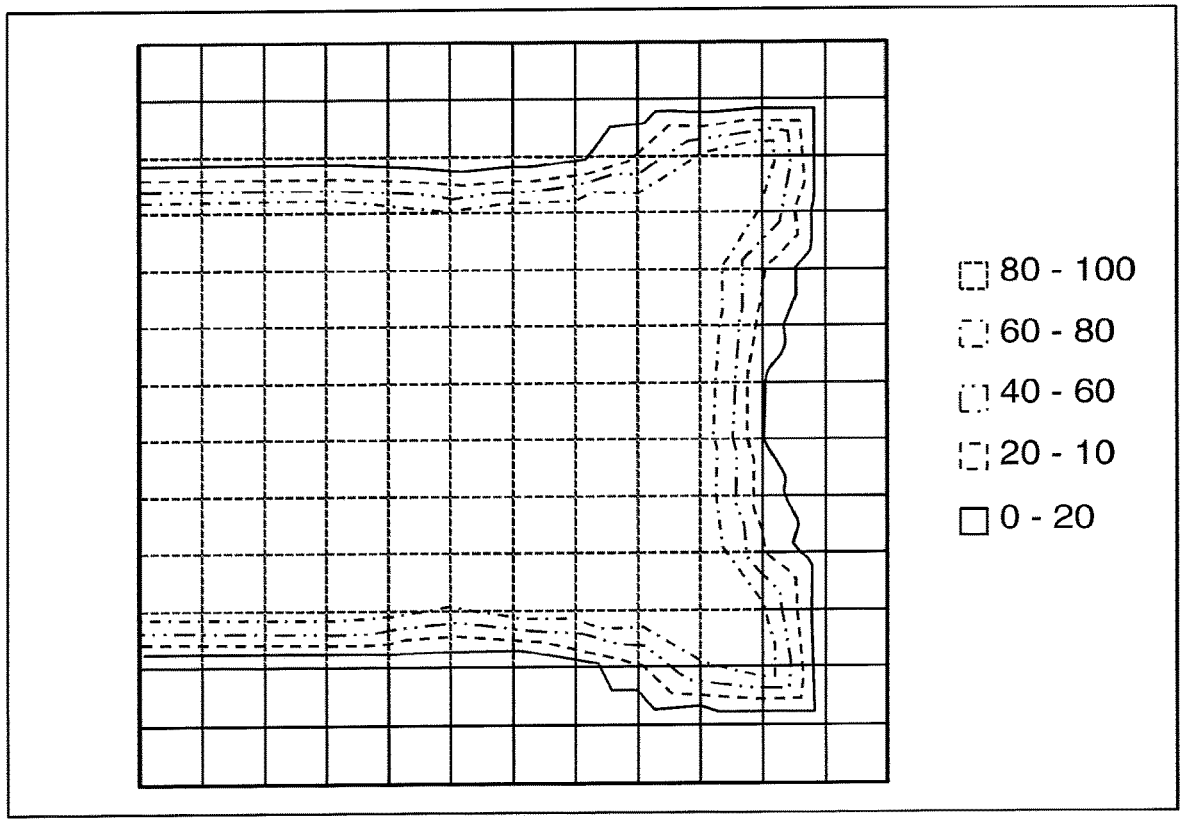
FIG. 17 shows an example of an irradiation pattern shape depicted in contour lines in the case of varying a correction dose treating a gray map figure as a correction figure according to the first embodiment.

FIG. 17 shows an example of an irradiation pattern shape depicted in contour lines in the case of varying the correction dose treating the gray map figure of FIG. 16A as a correction figure. In FIG. 17, the dose having been corrected per small region close to the end portion of the line pattern 10 is represented by a dose of 80 to 100%, a dose of 60 to 80%, a dose of 40 to 60%, a dose of 20 to 40%, and a dose of 0 to 20%. The actual irradiation shape is a shape with a skirt due to blurring added by the influence of beam resolution to the specified irradiation shape of the gray map correction figure. When the beam resolution affects pattern forming accuracy, a gray map correction figure is preferably formed considering the amount of blurring by the beam resolution. When the gray map correction figure according to the first embodiment is used, such irradiation shape correction can be efficiently executed.

As described above with reference to FIGS. 15A and 15B, it is suggested to use a gray (gradation) map figure based on the concept of a representative figure. The concept of a representative figure has been conventionally proposed for increase in efficiency of calculation of proximity effect correction, where a target region is divided into small regions, and one representative figure being each small region such as a rectangle represents a plurality of figures included in a small region concerned using the figure area in the small region (mesh) for each small region. By applying this concept of the representative figure, it is possible to show gradation change of the entire target region by representing the gradation level of the whole mesh concerned by using its area ratio of the figure for each mesh. In the gray (gradation) map figure of the first embodiment, gradation change of the entire map is represented by denoting, for each small region, the area ratio in the small region concerned by using the correction dose (gradation level) of the whole of the small region concerned. What has been described about the gray map figure is equivalent to representing the area ratio of the small region by arranging one representative figure in the small region. If, in the gray (gradation) map figure, just an area or an area ratio instead of the figure size in the small region is represented as a correction dose (gradation level), information about the shape is unnecessary, thereby having an advantage of small data amount. Moreover, it is convenient for processing to represent, for each mesh, the gradation level by a standardized relative value, ratio, or percentage. As mentioned above, representing the gradation per small region is hereinafter called a gray (gradation) map figure. In the case of FIGS. 15A and 15B, an outer shape is a rectangle, and gradation is defined for each of the mesh-like small regions inside the rectangle. Although the size of the mesh (small region) in FIG. 15B is uniform in the map, it is not limited thereto. The size of the mesh (small region) may not be uniform in the map. When there are many no-gradation-level portions (0%), the data amount can be reduced by performing data compression. If the downstream processing system is a type that does not accept the gradation level representation of a figure, that is, if the downstream processing system is the conventional type of 0/1 representation having no definition of figure gradation level, it can be executed if representing the gradation level of each mesh by defining a so-called representative figure such as rectangle in each mesh by using the size corresponding to the area ratio of the figure. In the case of pixelating the gray map figure, processing can be performed on the assumption that each mesh is a figure having the size of the mesh and the gradation level specified.

Next, there will be described an example of a method of selecting either a normal figure or a gray map figure, as a correction figure pattern. When actually performing shape correction, which to use either a normal figure or a gray map figure as the correction figure pattern is preferably selected in accordance with required accuracy so as to have less data amount (resulting in shorter processing time). The size of a correction figure is determined depending on required minuteness of the shape of a correction dose. If setting a finer (minuter) correction shape, the figure size needs to be finer. On the one hand, however fine the correction figure becomes, it is restricted by the resolution of a beam. That is, it is sufficient to make the correction figure fine enough to represent the gradation which can be denoted (indicated) by beam resolution. Thus, even if the correction figure becomes further finer, correction writing of gradation finer than the restriction of beam resolution cannot be executed. Therefore, when the correction figure is the minimum of the size restricted by the beam resolution, the representation of a gray map figure using the size of the minimum figure as a mesh size and the representation of a correction shape by the correction figure become around the same accuracy, thereby being useless to become finer than the minimum size. For example, in the case of a 10 nm beam, 5 nm pixel, and 5 nm beam resolution (=a value), if the mesh size of the gray map figure is made fine such as about 2.5 nm, that is about ½ of the pixel size, this mesh size can thoroughly represent fineness which can be represented by the beam resolution. Not limited to this example, since a setting error of corrected irradiation can be estimated by simulation and the like depending on the mesh size, the mesh size may be determined according to required accuracy. Although the processing time at the portion where raster data is generated by pixilation increases a little by adding a correction figure, since the amount of raster data does not change as characteristics of the multiple beam writing apparatus 100, the writing time does not change even when the correction figure is added. Moreover, as the correction figure is quantitatively small compared to the whole, the raster data can be generated without any problem by adding a little computer resources.

Figure 18A:
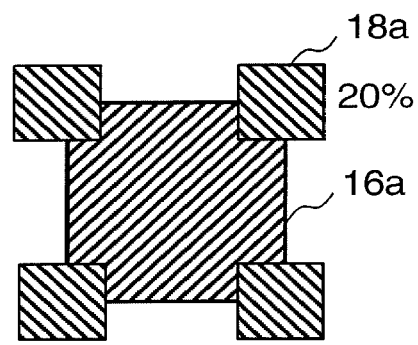
FIGS. 18A to 18C show examples of a correction figure pattern for correcting a corner R of a contact hole pattern according to the first embodiment.
Figure 18B:
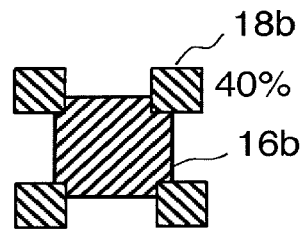
Figure 18C:
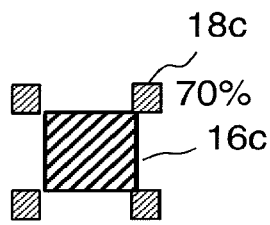

FIGS. 18A to 18C show examples of a correction figure pattern for correcting a corner R of a contact hole pattern according to the first embodiment. With respect to a small rectangular (including square) pattern such as a contact hole, there occurs a phenomenon in which the corner typically becomes round and smaller than the design shape. The round shape at the corner is approximated by a circumference, and the radius value of the circle of the circumference indicates the round (namely, the corner R). For improving such a shape change, there is a known method of increasing the dose of the corner portion. In the first embodiment, as shown in FIG. 18A, a correction figure pattern 18a according to the size of a contact hole pattern 16a to be written is arranged at each of the four corners of the contact hole pattern 16a. In forming the correction figure pattern 18a, with reference to a correction table, the position, figure type, size, and correction dose of the correction figure pattern 18a are defined/specified. In the case of FIG. 18A, +20% dose is defined as a correction dose. The correction figure pattern 18a is located to partially overlap with a portion of one of the four corners of the contact hole pattern 16a.

In the case of FIG. 18B, a correction figure pattern 18b according to the size of a contact hole pattern 16b which is to be written and smaller than the contact hole pattern 16a is arranged at each of the four corners of the contact hole pattern 16b. In forming the correction figure pattern 18b, with reference to the correction table, the position, figure type, size, and correction dose of the correction figure pattern 18b are defined/specified. In the case of FIG. 18B, +40% dose is defined as a correction dose. The correction figure pattern 18b is located to partially overlap with a portion of one of the four corners of the contact hole pattern 16b. The correction figure pattern 18b is arranged such that the overlapping portion with each of the four corners of the contact hole pattern 16b is smaller than the overlapping portion of the correction figure pattern 18a with the contact hole pattern 16a.

In the case of FIG. 18C, a correction figure pattern 18c according to the size of a contact hole pattern 16c which is to be written and smaller than the contact hole pattern 16b is arranged at each of the four corners of the contact hole pattern 16c. In forming the correction figure pattern 18c, with reference to the correction table, the position, figure type, size, and correction dose of the correction figure pattern 18c are defined/specified. In the case of FIG. 18C, +70% dose is defined as a correction dose. The correction figure pattern 18c is located to contact with one of the four corners of the contact hole pattern 16c without, for example, overlapping.

As shown in FIGS. 18A to 18C, the correction figure patterns 18a to 18c are arranged at the corners in order to add the dose. Since the correction figure pattern is formed independently of the writing pattern, and it may overlap with the writing figure as shown in FIGS. 18A and 18B. Therefore, the correction shape is simple. In the detection condition table, it is set to detect a contact hole pattern equal to or smaller than a specified dimension. In the correction table, arrangement information and gradation level (correction dose) of the correction figure for each dimension are defined. Then, correction can be executed by interpolating the correction dose and the arrangement position, in proportion to the dimension.

Figure 19:
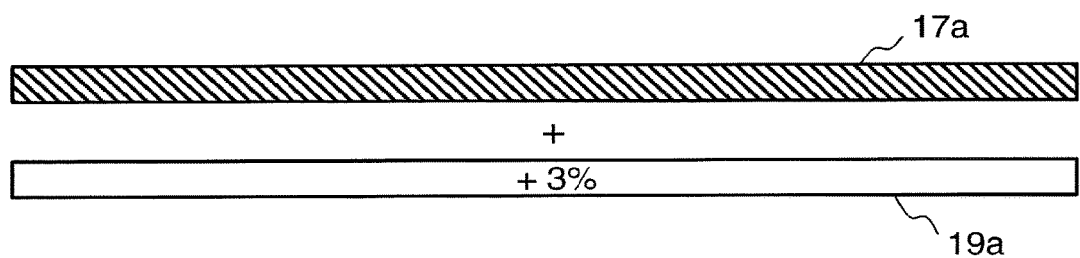
FIG. 19 shows an example of a correction figure pattern for line width correction (linearity correction) according to the first embodiment.

FIG. 19 shows an example of a correction figure pattern for line width correction (linearity correction) according to the first embodiment. With respect to a line pattern having a narrow line width, a phenomenon typically occurs in which the formed line pattern becomes smaller or larger than the design in proportion as the designed dimension becomes smaller. Evaluating whether the value of the line width formed to the design value becomes linear, not depending on dimension, is called linearity. In order to improve the problem of the above phenomenon, there is a known method of increasing the dose depending on a line width. Then, according to the first embodiment, as shown in FIG. 19, a correction figure pattern 19a having the same size and shape as those of a line pattern 17a being a writing target is arranged to be overlapped with the line pattern 17a. Although, for easy understanding, the correction figure pattern 19a is illustrated in a shifted manner, it actually overlaps with the line pattern 17a being a writing figure and having the equivalent line width. In forming the correction figure pattern 19a, with reference to the correction table, the position, figure type, size, and correction dose of the correction figure pattern 19a are defined/specified. In the case of FIG. 19, for example, +3% dose is defined as a correction dose, corresponding to the line width.

Figure 20:
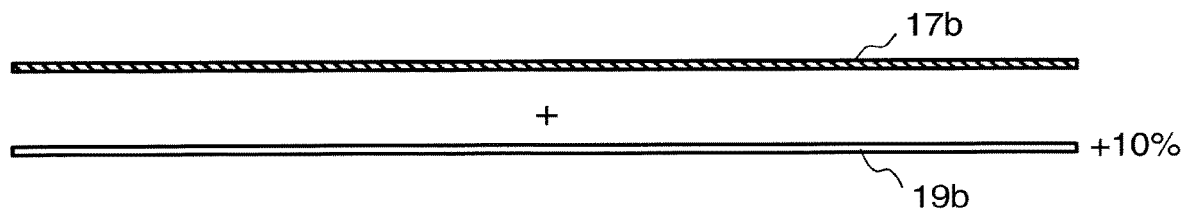
FIG. 20 shows another example of a correction figure pattern for line width correction (linearity correction) according to the first embodiment.

FIG. 20 shows another example of a correction figure pattern for line width correction (linearity correction) according to the first embodiment. In FIG. 20, shown is a line pattern 17b having a line width narrower than that of the example of FIG. 19. As shown in FIG. 20, a correction figure pattern 19b having the same size and shape as those of the line pattern 17b being a writing target is arranged to be overlapped with the line pattern 17b. Although, for easy understanding, the correction figure pattern 19b is illustrated in a shifted manner, it actually overlaps with the line pattern 17b being a writing figure and having the equivalent line width. In forming the correction figure pattern 19b, with reference to the correction table, the position, figure type, size, and correction dose of the correction figure pattern 19b are defined/specified. In the case of FIG. 20, for example, +10% dose is defined as a correction dose, corresponding to the line width.

As shown in FIGS. 19 and 20, according to the first embodiment, the correction dose is set by using additional correction figure patterns 19a and 19b not by variably setting the dose of the original figures (writing line patterns 17a and 17b). Thus, since the original figure data is not processed, it is easy to perform management. The examples of FIGS. 19 and 20 are on the assumption that if the line width is narrower than the design dimension, it is corrected to be wider by adding the dose corresponding to the line width. However, to the contrary, if the line width is wider than the design dimension, it is corrected to be narrower by reducing the dose by setting a minus dose for the correction figure. In the detection condition table, it is set to detect a line pattern equal to or smaller than a specified dimension. In the correction table, arrangement information and gradation level (correction dose) of the correction figure (in this case, being the same as a writing figure) for each dimension are defined. Then, correction can be executed by interpolating the correction dose, in proportion to the dimension.

Alternatively, instead of adding the dose of the writing figure, line width correction can be executed by setting an additional figure (correction figure) to be adjacent to the writing figure so that the writing line width may be increased or decreased. When performing the line width correction by using an additional figure, it becomes necessary to arrange figures at both the sides of the writing figure, but it has an advantage that the correction amount is clear. Thus, the line width correction based on both the methods can be carried out, and either one of them or combination of them can be selected depending on the situation.

In addition, it should be understood that both the correction figure pattern for correcting the corner R of a contact hole pattern, and the correction figure pattern for correcting the line width (linearity correction) can be formed by using the gray map figure described above.

Here, there is a problem in that if a correction figure pattern for correcting a shape is added on the raster data after proximity effect correction, since the conditions of the proximity effect change, the proximity effect correction cannot be satisfactorily performed. In other words, since the conditions of proximity effect correction are changed due to alteration of the figure shape change or addition of the correction figure, recalculation for proximity effect correction is needed in order to guarantee the writing accuracy. It is very difficult to execute, after adding or correcting a figure, calculation for proximity effect correction on pixel data after rasterization. Since the data amount of pixel data after rasterization is huge, executing calculation for accurate proximity effect correction within about the same time period as that of normal correction calculation has great difficulty. Regarding a region sampling method performed in correction processing on raster data, it normally uses a region of several pixels. For example, if the pixel size is 10 nm, the region is about 50 nm. On the other hand, for performing calculation processing of proximity effect correction, a larger region including the influence range of the proximity effect is needed. Normally, the region about 50 μm is needed. Since the data amount to be used increases by $N^2$ times the size of the region, it becomes a huge quantity, and therefore, it is difficult to execute calculation for proximity effect correction by the region sampling method. Moreover, as a simple method for proximity effect correction calculation performed on raster data, for example, there is a way of determining a correction dose based on a figure area per small region, but sufficient correction accuracy cannot be acquired. Thus, it is not preferable to again perform proximity effect correction on raster data because a great amount of resource and processing time are needed. Therefore, it is preferable to generate a correction figure pattern by setting a reference condition for the proximity effect, in the correction figure data generating step (S104) of the first embodiment.

Figures 21A, 21B:
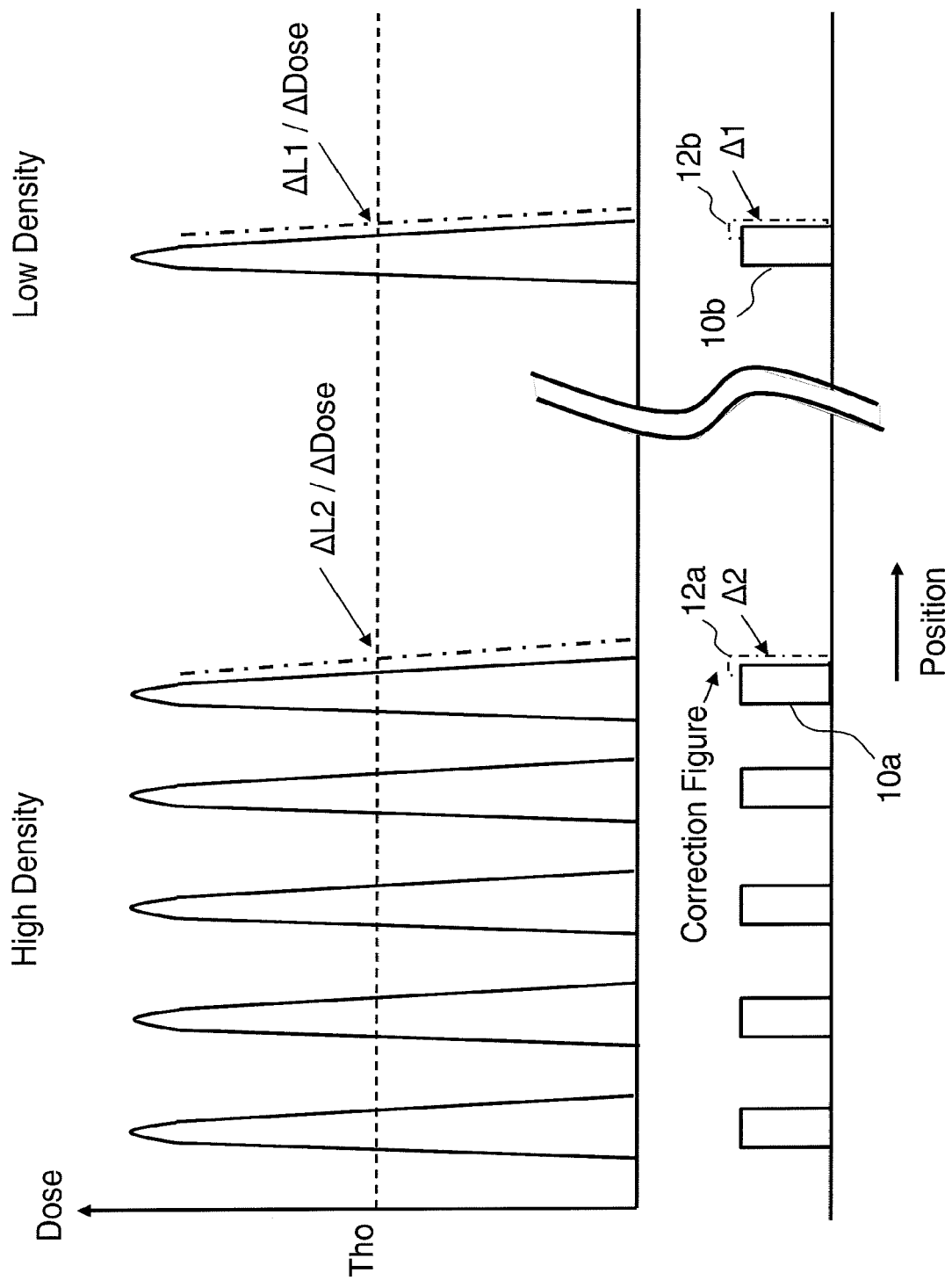
FIGS. 21A and 21B show examples of a dose distribution, writing figure, and correction figure under a reference condition according to the first embodiment.

FIGS. 21A and 21B show examples of a dose distribution, writing figure, and correction figure under a reference condition according to the first embodiment. In the case of correcting the resolution position of a pattern to be in accordance with a conversion difference (resolution position change/dose change), an actual conversion difference (resolution position change/dose change) changes depending on the amount of proximity effect. Therefore, when aiming to correct the resolution position of a pattern by using the dose, the correction amount cannot be determined unless checking the situation of the proximity effect. Regarding this problem, it is possible, when forming a correction figure, to calculate a corresponding conversion difference (resolution position change/dose change) with reference to the corrected irradiation coefficient of dose correction coefficient map ($D_p(x)$ map) for proximity effect correction generated using the writing figure, and to determine the correction figure based on the calculated conversion difference. However, recalculation for proximity effect correction needs to be performed in order to again guarantee the proximity effect condition which has been changed because of addition of the correction figure, thereby generating a problem needing a large amount of resource.

Then, according to the first embodiment, in the correction figure data generating step (S104), a reference condition is set for the proximity effect, and a correction figure is formed based on the reference condition. Next, in the dose correction calculating step (S106), proximity effect correction calculation is performed once (similarly to a conventional writing procedure) using a combination of the writing figure and the correction figure. Thereby, the dose of the correction figure is also corrected based on the condition of the actual proximity effect. It will be described specifically.

First, the reference condition is defined as being a condition for generating a specific proximity effect, that is, a condition assuming a specific pattern density, and a condition assuming that a reflected electron is generated from the substrate based on a specific pattern density ratio. Since the conversion difference (resolution position change/A dose) corresponding to the pattern density is obtained based on the reference condition, a correction figure can be formed regardless of an actual pattern density under this condition.

FIGS. 21A and 21B typically (schematically) show the resolution characteristics with respect to the dose of a part with a high pattern density where line patterns 10a are continuously arranged with a predetermined space, and with respect to the dose of a part with a low (nearly zero) pattern density where a line pattern 10b is isolatedly (separately) arranged, under the condition, as the reference condition, assuming that there is no proximity effect or no influence of a reflected electron, for example. FIG. 21A schematically shows an exposure amount generated by writing, and FIG. 21B similarly shows a dose for writing. Assuming that the reference condition is used, the conversion difference $\Delta L/\Delta\text{dose}$ (resolution position change/dose change) is almost the same regardless of pattern density. Here, the reference condition assumes that the conversion difference $\Delta L/\Delta\text{dose}$ (resolution position change/dose change) is almost the same regardless of pattern density. That is, when the correction figure pattern 12a is arranged for the line pattern 10a with a high pattern density, and when the correction figure pattern 12b is arranged for the line pattern 10b with a low pattern density, approximately (assuming a small amount of correction), $\Delta L1/\Delta\text{dose}=\Delta L2/\Delta\text{dose}$. If in the case of there being pattern density dependence due to other process factors (e.g., resist development characteristics, etching characteristics, etc.), the conversion difference may not be exactly the same value in each case. Such a characteristic can be additionally corrected, as needed, on the basis of the present correction mechanism. The threshold models of FIGS. 21A and 21B are on the assumption of being resolved at 50% dose (pattern edge position is determined). Although, in the example of FIGS. 21A and 21B, the reference condition is on the assumption that there is no proximity effect, where the condition is almost the same as that of the isolated (separated) pattern, it is also possible to set the reference condition to be other condition (e.g., L/S of 1:1, etc.).

FIGS. 22A and 22B show examples of a dose distribution, writing figure, and correction figure after proximity effect correction according to the first embodiment. FIGS. 22A and 22B typically (schematically) show the resolution characteristics with respect to the dose of a part with a high pattern density where line patterns 10a' are continuously arranged with a predetermined space, and with respect to the dose of a part with a low (nearly zero) pattern density where a line pattern 10b' is isolatedly (separately) arranged. FIG. 22A schematically shows an exposure amount including a reflected electron generated by writing, and FIG. 21B similarly shows a dose for writing. In proximity effect correction, the dose is corrected so that a predetermined line width may be resolved in the state where an exposure amount (dose) by a reflected electron and an exposure amount (dose) by beam irradiation are added. Therefore, as shown in FIG. 22A, correction is performed according to the pattern density so that the resolution line width may be the same as each other, by treating that the dose is small when the density is high. Also in this case, the model assuming that the pattern edge position is resolved at 50% dose is used. If the dose becomes smaller in accordance with the pattern density, the change amount of the resolution position with respect to a predetermined dose change increases. For example, when the dose becomes smaller (e.g., k times (k<1)), approximately (assuming a small amount of correction), the conversion difference $\Delta L/\Delta\text{dose}$ inversely becomes larger by 1/k times. That is, when a correction figure pattern 12a' is arranged for a line pattern 10a' having a high pattern density, it is $\Delta L2'/\Delta\text{dose}=(\Delta L2/\Delta\text{dose})/k$ as shown in FIG. 22A. The conversion difference $\Delta L/\Delta\text{dose}$ typically (schematically) corresponds to the gradient of the resolution position of the dose graph of FIG. 22A. If the graph height increases by k times, the side slope gradient which shows $\Delta\text{dose}/\Delta L$ also proportionally increases by k times. If representing by $\Delta L/\Delta\text{dose}$, it becomes an inverse 1/k times. When calculation for proximity effect correction is performed, the dose of the correction figure is also corrected to be smaller by the same ratio (k times), and consequently, it is corrected by a desired amount $\Delta L$. That is, since $\Delta L1/\Delta\text{dose}=\Delta L2/\Delta\text{dose}$ in the reference condition shown in FIGS. 21A and 21B, if assuming the correction amount of the resolution position to be $\Delta 1=\Delta 2$, and the dose S for the correction figure to be the same dose, the correction amount $\Delta 1$ can be defined by the following equation (1).

$$\Delta 1=(\Delta L1/\Delta\text{dose})\cdot S=\Delta 2=(\Delta L2/\Delta\text{dose})\cdot S \qquad (1)$$

After the proximity effect correction calculation shown in FIGS. 22A and 22B, since the dose remains as it is at the portion where almost no proximity effect occurs, $\Delta L1'/\Delta\text{dose}=\Delta L1/\Delta\text{dose}$ is still kept, and therefore, the resolution position can be corrected by $\Delta 1$ using the dose S for the correction figure. That is, the correction dose $\Delta 1'$ after the calculation for proximity effect correction can be defined by the following equation (2).

$$\Delta 1'=(\Delta L1'/\Delta\text{dose})\cdot S=(\Delta L1/\Delta\text{dose})\cdot S=\Delta 1 \qquad (2)$$

On the other hand, at a portion with a high pattern density, the dose becomes k times by proximity effect correction, that is, the dose for a correction figure also becomes k times namely kS. Since $\Delta L2'/\Delta\text{dose}=(\Delta L2/\Delta\text{dose})/k$, the correction amount $\Delta 2'$ after the calculation for proximity effect correction can be defined by the following equation (3).

$$\Delta 2' = (\Delta L2'/\Delta\text{dose})\cdot kS = \{(\Delta L2/\Delta\text{dose})/k\}\cdot kS \qquad (3)$$
$$= (\Delta L2/\Delta\text{dose})\cdot S = \Delta 2$$

Thus, also after executing the proximity effect correction, the resolution position of the same (unchanged) amount $\Delta 2$ can be corrected.

In the first embodiment, when generating pattern data of a correction figure pattern including dose information, the correction figure pattern is formed under the condition (reference condition) assuming a uniform specific pattern density (e.g., 0%). Then, a correction coefficient for correcting a proximity effect is calculated for each unit region using an actual pattern density obtained by unifying a figure pattern defined in the writing data and a correction figure pattern. In other words, calculation for correcting a proximity effect is performed by integrating writing data and correction data. Regarding the density of a correction figure pattern, the area value is corrected by multiplying the gradation level (relative value to reference dose) by the density. Then, a dose correction coefficient map ($D_p(x)$ map) for specifying a dose correction coefficient is generated per unit region for correcting the proximity effect. Since the correction figure pattern is generated based on an assumed specific pattern density, the dose correction coefficient map is set such that the dose increases or decreases depending on the difference between a set reference condition and an actual pattern density. It is convenient to set, in the dose correction coefficient map, the dose to be increased or decreased per unit region as a ratio to the reference dose of the reference condition. As a dose corresponding to a value defined in combined-value pixel data, the dose obtained by multiplying the reference dose, the rate to the reference dose of a value defined in the combined-value pixel data, and a correction coefficient is used. In other words, when writing a pattern on a target object, each pixel is irradiated with a beam of the dose corrected by multiplying the dose corresponding to the value defined in the combined-value pixel data by a correction coefficient of the dose correction coefficient map. Specifically, it operates as follows: Before executing calculation for correcting a proximity effect in the dose correction calculating step (S106), the reference condition is set in the correction figure data generating step (S104), and then, considering the conversion difference (resolution position change/dose change) generated in setting the reference condition, a correction figure pattern is formed. Since evaluation is normally performed based on the line width, it is easier to understand to represent the conversion difference as "line width change/dose change". However, here, instead of using the line width, the conversion difference is represented as "resolution position change/dose change" to indicate the change of the resolution position of the pattern edge at one side. In the proximity effect correction, assuming that it is resolved at 50% dose, for example, as a threshold in process conditions, the incident dose for each portion is adjusted so that it may be resolved at 50% of dose by totaling the incident dose and the level of the exposure amount (dose) of a reflected electron in the case of there being a proximity effect. Accordingly, before calculation for proximity effect correction, the correction figure is preferably generated such that the resolution position is shifted to a predetermined position when the dose is 50%, assuming a condition (reference condition) of no proximity effect, for example. Regarding the reference condition, for example, it is also possible to select/set other condition such as 50% figure density. However, through proximity effect correction, if the portion with 0 (zero) density is treated as a reference, the dose can be used as it is, whereas at the portion with a high density, the dose is adjusted to be decreased, and thereby adjusted to make the line width unchanged. Therefore, it is easy to understand to make the reference condition be on the assumption of having 0 (zero) density, namely no exposure by a reflected electron. For example, when the reference condition is set to be 50% figure density, the exposure amount by a reflected electron is 50% of the case of the pattern density being 100%. That is, the condition in which a proximity effect occurs under the influence of the 50% reflected electron is set as the reference condition. In that case, in calculation for correcting the proximity effect, correction is performed by increasing or decreasing the dose depending on the difference between the proximity effect which an actual pattern receives and the set value of the reference condition. Therefore, when the reference condition is set to be in accordance with the target density (pattern density to optimize accuracy) of a pattern to be actually written, the correction amount can be small, thereby being able to execute correction with great approximation accuracy. Thus, it is preferable to change the reference condition according to the density (target density) of a writing pattern. In that case, if the target density is various depending on the position of the writing pattern, it is also effective to change, for each region, the reference condition according to the target density.

The parameter of the reference condition can be determined by experiment, simulation, or the like. Here, there will be described an example in which the conversion difference (resolution position change/dose change) is obtained, as a parameter of the reference condition, in advance by experiment under the condition assuming there is no exposure by a reflected electron. Although the conversion difference changes by process conditions, such as a developing condition (developing time), it is here assumed that an experiment evaluation is performed while a process condition is fixed.

The conversion difference (resolution position change/dose change) can be determined from a result of writing in which proximity effect correction has been performed and the pattern density and dose have been changed. 0% of the density can be obtained by evaluating a conversion difference (resolution position change/dose change) by using an isolated (separated) writing pattern (assuming about 0%). Further, with respect to the conversion difference of the portion not being 0% density, the conversion difference which should be set for the original figure can be known by comparing the original correction amount being the reference condition of an evaluation pattern, and the deviation amount of a written figure. In that case, in the reference condition, since the conversion difference with respect to an isolated (separated) pattern and the conversion difference to be set with respect to the original figure before proximity effect correction at the portion not being 0% density should be equivalent to each other, the existence or nonexistence (influence level) of other change factors can be verified by comparing both the conversion differences.

According to the first embodiment, if the correction amount (figure size and correction dose (gradation level)) is set under the reference condition before calculation for proximity effect correction, the set correction amount can be matched with a desired correction amount even after executing the proximity effect correction. Setting the correction dose (gradation level) of a correction figure to be based on the ratio to the reference dose (criterion dose) is convenient for processing. Consequently, it is sufficient, on the whole, to perform the calculation of proximity effect correction once even if a correction figure pattern is added. Therefore, the conventional complicated processing of a huge amount, such as performing correction calculation of a figure on the raster data after proximity effect correction and, in order to correct its influence, again performing calculation for proximity effect correction, becomes unnecessary, thereby greatly reducing the resource.

Moreover, in a writing experiment for obtaining the conversion difference (resolution position change/dose change), it is presupposed, as the reference condition, that the conversion difference with respect to an isolated (separated) pattern is equivalent to the conversion difference to be set with respect to the original figure at the portion not being 0% density. However, in the case of deviating from this model due to other processing factors or a non-linear characteristic, etc., if this state of the deviation is quantitatively larger than the required accuracy, correction depending on a pattern density can be concurrently used. In that case, since the correction amount is small, it may be sufficient to correct the conversion difference by using a linear primary coefficient depending on the pattern density. Moreover, if there are different conversion differences due to an influential condition such as fogging, etc. in addition to the proximity effect correction, if correction is performed for the conversion difference depending on the fogging, etc., the proximity effect correction can be executed with sufficient accuracy under a more extensive condition.

Moreover, when forming a correction figure pattern, if a correction figure pattern with a + gradation level and a correction figure pattern with a − gradation level are arranged close to each other, correction can be performed without largely changing the condition of the proximity effect even if a figure is added. Since the condition of the proximity effect after this correction does not largely deviate from the original proximity effect condition even if shape correction is performed, the range of the shape correction may be extended with maintaining the accuracy without apparently showing the influence by other factors such as non-linearity of the process.

As described above, according to the first embodiment, there is no necessity of preparing a special writing processing mechanism for correction, such as region sampling calculation processing. What is necessary is just to perform addition/subtraction on the pixel data for writing since the correction figure can be pixelated using a rasterizer similar to the one used for normal writing figure data. Moreover, when correction figure pattern data is independently maintained, the original writing figure data is just to be maintained without changing, and thus, efficient processing can be performed, thereby having an advantage of being easy to control. Since the correction figure pattern data changes depending on process conditions, it is useless to reprocess the entire data including the original figure when a small change has occurred. In the case of conditions being changed partially, it is just necessary to perform processing for only corresponding correction figure data. Since the correction figure pattern data is generally a small amount compared to the original figure data, it is possible to have several data of various correction conditions, which leads to reducing the storage capacity. Moreover, as to data verification, etc., since the original figure data and the correction figure data are distinguished, the corresponding relation is easy to understand, thereby being easy to perform verification. In contrast, in the case of performing correction on pixel data after rasterization, such as a conventional case, since the data amount is huge, maintaining the pixel data after processing is not realistic, and verification of the result data requires a lot of work. Moreover, according to the first embodiment, various correction can be carried out by enabling a correction figure to represent ±figure gradation (dose level) including a minus dose.

Now, a writing apparatus of the first embodiment and a variable shaped beam (VSB) writing apparatus being an example of an electron beam writing apparatus are compared. In VSB writing, if the number of the correction figures is increased in order to acquire sufficient accuracy, the number of figures increases, that is the number of shots increases, and therefore the throughput decreases. Since the VSB writing is based on the assumption of dividing into shot figures, minus shot figures do not exist from the first, and complicated additional shots are normally avoided because of priority conditions of not increasing the number of shots. In contrast, as to the writing apparatus which performs raster writing according to the first embodiment, since the amount of writing pixel data after rasterization does not change even if the number of figures increases, the throughput does not decrease. Although the amount of preprocessing increases by the amount of additional figures, since the increased amount is smaller than the processing amount of writing data, such a state can be solved by adding some resource if necessary.

In the VSB writing, since the correction amount changes depending on process conditions, it is necessary, for verification, to maintain data after processing for each process condition. Thereby, the amount of held data increases, therefore, the capacity of the storage device increases, further, the access time for verification is long, and complicated processing is needed. On the other hand, in the writing apparatus which performs raster writing according to the first embodiment, since the amount of writing raster data is huge, it is, from the beginning, problem to maintain the raster data intact, and furthermore, it is difficult to store/maintain it for each process condition. Therefore, in the first embodiment, increase in data amount is suppressed by separately maintaining a correction figure as pattern data before rasterization from the original figure data. In addition, even in the VSB writing apparatus, it is possible to some extent to suppress the increase in data amount by separately maintaining correction figure data and storing/maintaining the correction figure data under multiple conditions as separate files while maintaining the original figure data. However, conventionally, there is no concept of a correction figure for which +/−gradation level is defined. Particularly, with respect to a correction figure for which a minus dose is reflected, there is no method other than changing the shape of the original figure, and since the shape after processing is the one changed from the original figure, it becomes necessary to individually control it as a corrected original figure.

In the conventional raster writing, processing is limited to the one performed on an ideal grid (XY grid dimensions are equal in the whole region where grids are formed). In contrast, in the first embodiment, deviation of the beam irradiation position and the like can be corrected by generating writing raster data (writing pixel data) in a non-uniform grid whose XY dimensions are not equal in the whole region where grids are formed. In such a case, since the conventional figure processing after pixelation (after rasterization) is difficult to execute, the method according to the first embodiment is especially effective.

In the conventional correction processing after pixilation, a computing mechanism (exclusive hardware is designed for each processing) is needed. In contrast, in the first embodiment, since raster data can be generated by performing rasterization processing for a correction figure by using a mechanism similar to the rasterizer used for writing data processing, an additional hardware and the like for figure calculation by pixel data after pixelation becomes unnecessary. Although the example of FIG. 1 shows the case where rasterization processing of writing data and that of a correction figure are performed by different configurations, it is also acceptable to perform the rasterization processing in order by using one configuration.

In the conventional correction processing after pixelation, since the amount of raster data is large, it is difficult to execute proximity effect correction with sufficient accuracy. In contrast, in the first embodiment, correction with sufficient high accuracy can be performed by using a method of calculating proximity effect correction (dose correction amount) including a correction figure based on the same method as that conventionally used for the original figure.

In the conventional correction processing after pixelation, the amount of held data increases, therefore, the capacity of the storage device increases, further, the access time for verification is long, and complicated processing is needed. In contrast, in the first embodiment, by separately maintaining correction figure pattern data having a +/−correction dose (gradation level) from other data, the original writing figure data can be maintained as it is without changing, and therefore, increase in the data amount can be suppressed. Further, since the amount of correction figure pattern data is small, the access time is fast, and processing can be performed at a high speed. Moreover, when data of the original writing figure has a hierarchical structure, since the hierarchical structure of the original figure data can be maintained intact, it is possible, by performing correction, to avoid the problem of data amount increase due to breaking of the hierarchical structure. As to correction data, by using the same or similar data compression method as that for writing data, the data amount can further be reduced and processing can be performed at a high speed.

In the conventional correction processing after pixelation, since the processing is performed per pixel, a calculation error occurs due to the restriction depending on the pixel size. When a finite pixel size is used, a correction calculation error occurs depending on it. If the pixel size is reduced to decrease the restriction, the problem occurs that the data amount increases, and processing becomes complicated because the number of pixels increases by square in the unit region referred in region sampling calculation. In contrast, in the first embodiment, since a correction figure pattern defined by vector data is used, it is no particular problem even to set the figure size set resolution of 0.001 nm (or below) with respect to the required accuracy of 1 nm. Therefore, substantially, there is no error due to the set resolution, thereby performing calculation processing with high accuracy. However, in contrast, in the conventional correction processing after pixelation, the data amount of the processing for obtaining the set resolution of, for example, 0.001 nm (pixel size of 0.001 nm) becomes 100,000,000 times the case of the pixel size of, for example, 10 nm, which is inexecutable data-quantitatively and substantially.

As described above, according to the first embodiment, local shape deviation of a writing pattern can be efficiently corrected in the case of performing electron beam writing using pixel data.

Embodiments have been explained referring to specific examples described above. However, the present invention is not limited to these specific examples.

Although, in the examples described above, corrections for linearity, short range proximity effect, corner R, and line shortening have been explained, these are just examples and the same correction logic can be applied to other shape in need of correction. In the examples described above, the case of there being no other pattern circumferentially has been described. If there is a neighboring/contacting pattern, deformation may be different from the above example due to influence of such as pattern density difference. Thus, not limited to the above, when there is other shape needing correction, what is necessary is just to add a logic for generating a correction figure in accordance with each shape in need of correction.

The examples described above are on the assumption of a recess pattern of positive resist, where the pattern is formed by removing the resist at the irradiation part. In the case of the recess pattern of negative resist, the correction logic may be created according to each process condition.

Although correction examples serving as Embodiments have been described above, it is not limited to them. With respect to various shape patterns, various corrections are executable using from simple to detailed methods. Such methods can be variously combined to use.

In the above examples, correction figures are variously arranged to correct deformation. Suitably arranging + or − correction figure has advantages that dimensions are corrected, and correction can be performed without a harmful effect, such as affecting an adjacent portion needing no correction.

The optimum value of arrangement of the correction figure and the optimum value of the correction amount are preferably determined by simulation or through experiment evaluation. In either case, preferably, the correction figure is generated considering a dose profile (resolution). It is recommended to verify the influence of resolution by experiment, simulation, or the like in advance. For example, when a rectangular correction figure pattern is arranged, since the change of dose resolution generated in that size can be estimated by simulation, etc., the figure size is preferably determined according to required accuracy.

By executing the correction method of arranging + and − correction figures to be close to each other and of making the dose be plus/minus zero, an effect is expected in that shape correction can be performed without largely changing the correction condition of proximity effect, that is, without performing recalculation for proximity effect correction even when a figure is added. This effect is particularly effective, for example, when the reference condition described above is not set, or when errors occur more than estimated even when the reference condition is set.

It is possible to set the correction dose (gradation level) of a correction figure to be 100% or greater to the reference dose, and to set a high level correction. However, in that case, writing time may be increased depending on a writing sequence, and therefore, should be determined based on conflicting requirements.

While the apparatus configuration, control method, and the like not directly necessary for explaining the present invention are not described, some or all of them can be selectively used case-by-case basis when needed. For example, although description of the configuration of the control system for controlling the writing apparatus 100 is omitted, it should be understood that some or all of the configuration of the control system can be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a storage device configured to store writing pattern data defining a plurality of figure patterns;
detection circuitry configured to detect a figure portion whose shape needs to be corrected in the plurality of figure patterns, by interpreting shapes of the plurality of figure patterns;
correction figure data generation circuitry configured to generate pattern data of a correction figure pattern for correcting the figure portion detected, where the pattern data includes dose information to identify a dose of the correction figure pattern;
writing pattern data conversion circuitry configured to convert the writing pattern data of the plurality of figure patterns into writing pattern pixel data defining a value corresponding to a dose for each pixel;
correction figure pattern data conversion circuitry configured to convert the pattern data of the correction figure pattern into correction figure pattern pixel data defining a value corresponding to a dose for the each pixel, based on pixel setting common to that of the writing pattern pixel data;
combined-value pixel data generation circuitry configured to generate, for the each pixel, combined-value pixel data by adding the value defined in the writing pattern pixel data and the value defined in the correction figure pattern pixel data; and a writing mechanism configured to write, using a charged particle beam, a pattern on a target object such that the each pixel is irradiated with a beam of a dose corresponding to a value defined in the combined-value pixel data.

2. The apparatus according to claim 1, wherein the correction figure data generation circuitry generates the pattern data of the correction figure pattern which defines shape data of the correction figure pattern, and the dose information to identify one of a plus dose and a minus dose corresponding to contents of correction.

3. The apparatus according to claim 1, wherein the correction figure data generation circuitry generates the pattern data of the correction figure pattern which defines dose information for each small region which is obtained by dividing a correction figure into a plurality of small regions in a mesh form.

4. The apparatus according to claim 3, wherein the correction figure data generation circuitry generates the pattern data of the correction figure pattern which defines as the dose information of at least one of the plurality of small regions, dose information to identify a minus dose.

5. The apparatus according to claim 2, wherein, the correction figure data generation circuitry generates the pattern data of the correction figure pattern so that as the correction figure pattern for correcting the figure portion, a first correction figure pattern for which dose information to identify a plus dose is defined and a second correction figure pattern for which dose information to identify a minus dose is defined are arranged closely to each other.

6. The apparatus according to claim 1, wherein the storage device includes a first storage device and a second storage device, the first storage device stores the writing pattern data, and the second storage device stores, as a separate file from the writing pattern data, the pattern data of the correction figure pattern.

7. The apparatus according to claim 1, wherein the combined-value pixel data generation circuitry configured to generate the combined-value pixel data so that there exists a pixel for which a value smaller than the value defined in the writing pattern pixel data before combining is defined as a value defined in the combined-value pixel data.

8. The apparatus according to claim 1, wherein
the writing pattern data conversion circuitry converts the writing pattern data into the writing pattern pixel data in which zero or a plus value is defined with respect to each pixel, and
the correction figure pattern data conversion circuitry converts the pattern data of the correction figure pattern into the correction figure pattern pixel data in which a minus value is defined with respect to at least one pixel.

9. The apparatus according to claim 1, wherein:
the storage device is further configured to store a correction table defining an arrangement position, a figure type, a size, and dose information of the correction figure pattern, to be related to the shape and a dimension of the figure portion to be detected.

10. A charged particle beam writing method comprising:
detecting a figure portion whose shape needs to be corrected in a plurality of figure patterns, by reading writing pattern data defining the plurality of figure patterns stored in a storage device, and interpreting shapes of the plurality of figure patterns;

generating pattern data of a correction figure pattern for correcting the figure portion detected, where the pattern data includes dose information to identify a dose of the correction figure pattern;

converting the writing pattern data of the plurality of figure patterns into writing pattern pixel data defining a value corresponding to a dose for each pixel;

converting the pattern data of the correction figure pattern into correction figure pattern pixel data defining a value corresponding to a dose for the each pixel, based on pixel setting common to that of the writing pattern pixel data;

generating, for the each pixel, combined-value pixel data by adding the value defined in the writing pattern pixel data and the value defined in the correction figure pattern pixel data; and writing, using a charged particle beam, a pattern on a target object such that the each pixel is irradiated with a beam of a dose corresponding to a value defined in the combined-value pixel data.

11. The method according to claim 10, wherein, when generating the pattern data of the correction figure pattern including the dose information, the correction figure pattern is formed under a condition assuming a uniform specific pattern density, further comprising:
calculating, for each unit region, a correction coefficient for correcting a proximity effect using an actual pattern density obtained by unifying a figure pattern defined in the writing pattern data and the correction figure pattern,
wherein, as a dose corresponding to a value defined in the combined-value pixel data, a dose obtained by multiplying a reference dose, a rate to the reference dose of a value defined in the combined-value pixel data, and the correction coefficient is used.

12. The method according to claim 10, wherein the pattern data of the correction figure pattern defines shape data of the correction figure pattern, and the dose information to identify one of a plus dose or a minus dose corresponding to contents of correction.

13. The method according to claim 10, wherein the pattern data of the correction figure pattern defines dose information for each small region which is obtained by dividing a correction figure into a plurality of small regions in a mesh form.

14. The method according to claim 13, wherein the dose information of at least one of the plurality of small regions is dose information to identify a minus dose.

15. The method according to claim 12, wherein, as the correction figure pattern for correcting the figure portion, a first correction figure pattern for which dose information to identify a plus dose is defined and a second correction figure pattern for which dose information to identify a minus dose is defined are arranged closely to each other.

16. The method according to claim 10, wherein the storage device stores, as separate files, the writing pattern data and the pattern data of the correction figure pattern.

17. The method according to claim 10, wherein there exists a pixel for which a value smaller than the value defined in the writing pattern pixel data before combining is defined as a value defined in the combined-value pixel data.

18. The method according to claim 10, wherein, with respect to the each pixel in the writing pattern pixel data, zero or a plus value is defined, and
with respect to at least one pixel in the correction figure pattern pixel data, a minus value is defined.

19. The method according to claim 10, wherein the pattern data of the correction figure pattern is generated while referring to a correction table defining an arrangement position, a figure type, a size, and dose information of the correction figure pattern, to be related to the shape and a dimension of the figure portion to be detected.

* * * * *